US 11,005,354 B2
United States Patent
Arai et al.

(10) Patent No.: US 11,005,354 B2
(45) Date of Patent: May 11, 2021

(54) POWER CONVERSION CIRCUIT

(71) Applicant: SHINDENGEN ELECTRIC MANUFACTURING CO., LTD., Tokyo (JP)

(72) Inventors: Daisuke Arai, Saitama (JP); Shigeru Hisada, Saitama (JP); Mizue Kitada, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 39 days.

(21) Appl. No.: 16/490,558

(22) PCT Filed: Nov. 17, 2017

(86) PCT No.: PCT/JP2017/041402
§ 371 (c)(1),
(2) Date: Sep. 1, 2019

(87) PCT Pub. No.: WO2019/097662
PCT Pub. Date: May 23, 2019

(65) Prior Publication Data
US 2020/0076290 A1    Mar. 5, 2020

(51) Int. Cl.
*H01L 29/06* (2006.01)
*H01L 29/78* (2006.01)
(Continued)

(52) U.S. Cl.
CPC .......... *H02M 1/00* (2013.01); *H01L 29/0634* (2013.01); *H01L 29/7805* (2013.01);
(Continued)

(58) Field of Classification Search
CPC .................. H02M 1/00; H02M 3/155; H02M 2001/0051; H02M 2001/0054;
(Continued)

(56) References Cited

U.S. PATENT DOCUMENTS 4,720,734 A * 1/1988 Amemiya ......... H01L 21/28537
257/484
5,162,876 A * 11/1992 Kitagawa ............ H01L 29/0804
257/133
(Continued)

FOREIGN PATENT DOCUMENTS

JP    2010-3841 A    1/2010
JP    2012-143060 A    7/2012
JP    2014-530484 A    11/2014

OTHER PUBLICATIONS

Chimento et al., Super-Junction MOSFET and SiC Diode Application for the Efficiency Improvement in a Boost PFC Converter, 2006, IEEE, pp. 2067-2072. (Year: 2006).*
(Continued)

*Primary Examiner* — Gary L Laxton
(74) *Attorney, Agent, or Firm* — Hauptman Ham, LLP

(57) ABSTRACT

A power conversion circuit includes: a MOSFET having a super junction structure; an inductive load; and a freewheel diode. A switching frequency of the MOSFET is 10 kHz or more. When the MOSFET is turned off, a first period during which a drain current decreases, a second period during which the drain current increases, and a third period during which the drain current decreases again appear in this order. The freewheel diode is an Si-FRD or an SiC-SBD, and current density obtained by dividing a current value of the forward current by an area of an active region of the freewheel diode falls within a range of 200 A/cm² to 400 A/cm² when the freewheel diode is the Si-FRD, and the current density falls within a range of 400 A/cm² to 1500 A/cm² when the freewheel diode is the SiC-SBD.

22 Claims, 9 Drawing Sheets

(51) Int. Cl.
*H02M 3/155* (2006.01)
*H02M 1/00* (2006.01)
(52) U.S. Cl.
CPC ...... *H01L 29/7806* (2013.01); *H01L 29/7813* (2013.01); *H02M 3/155* (2013.01); *H02M 2001/0051* (2013.01); *H02M 2001/0054* (2013.01)
(58) Field of Classification Search
CPC ............. H01L 29/0634; H01L 29/7805; H01L 29/7806; H01L 29/7813; H01L 29/06; H01L 29/78
See application file for complete search history.

(56) References Cited

U.S. PATENT DOCUMENTS

| | | | | |
|---|---|---|---|---|
| 2011/0248286 A1* | 10/2011 | Onose | ................. | H01L 29/7803 257/77 |
| 2013/0062723 A1 | 3/2013 | Henning et al. | | |
| 2016/0056284 A1* | 2/2016 | Goerlach | ............ | H01L 29/4916 257/330 |
| 2016/0307993 A1* | 10/2016 | Kuribayashi | ........... | H01L 29/47 |
| 2016/0372609 A1* | 12/2016 | Kiyama | ................ | H01L 29/402 |

OTHER PUBLICATIONS

International Search Report in PCT/JP2017/041402, dated Feb. 20, 2018, 4pp.
Daisuke Arai et al., "Dependence of Switching Waveform on Charge Imbalance in Superjunction MOSFET used in Inductive Load Circuit", Proceedings of the 29th International Symposium on Power Semiconductor Devices & ICs, May 28, 2017, pp. 487-490, Sapporo, Japan, 4pp.
Search Report in NL Application No. 2021932, dated Jul. 4, 2019, 9pp.

* cited by examiner

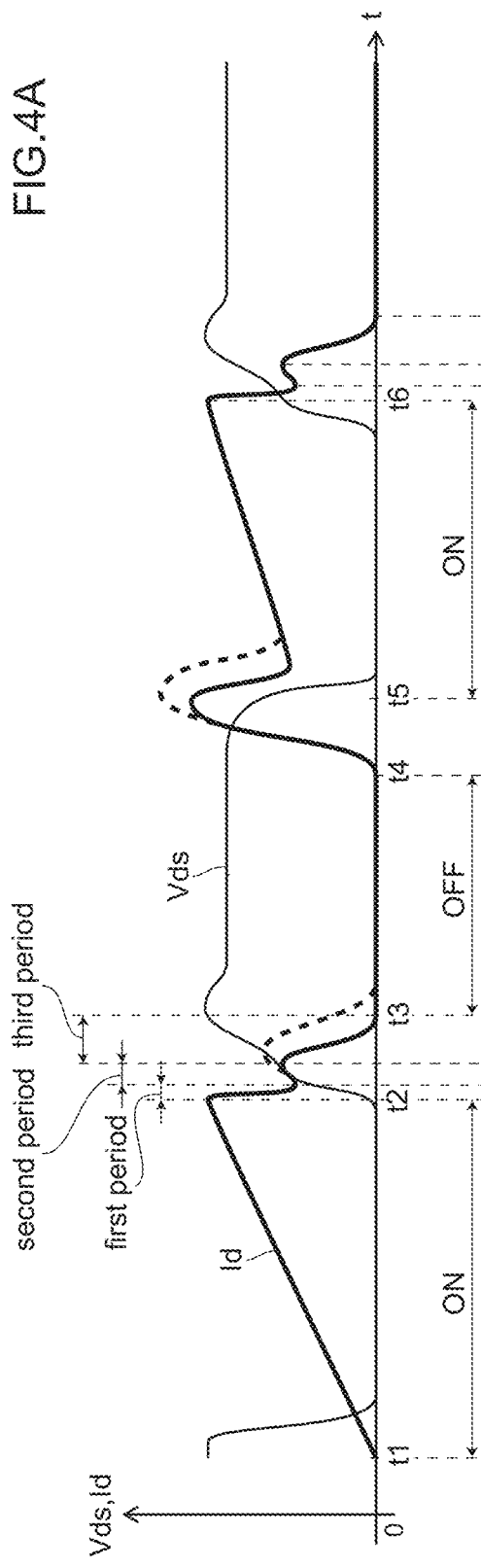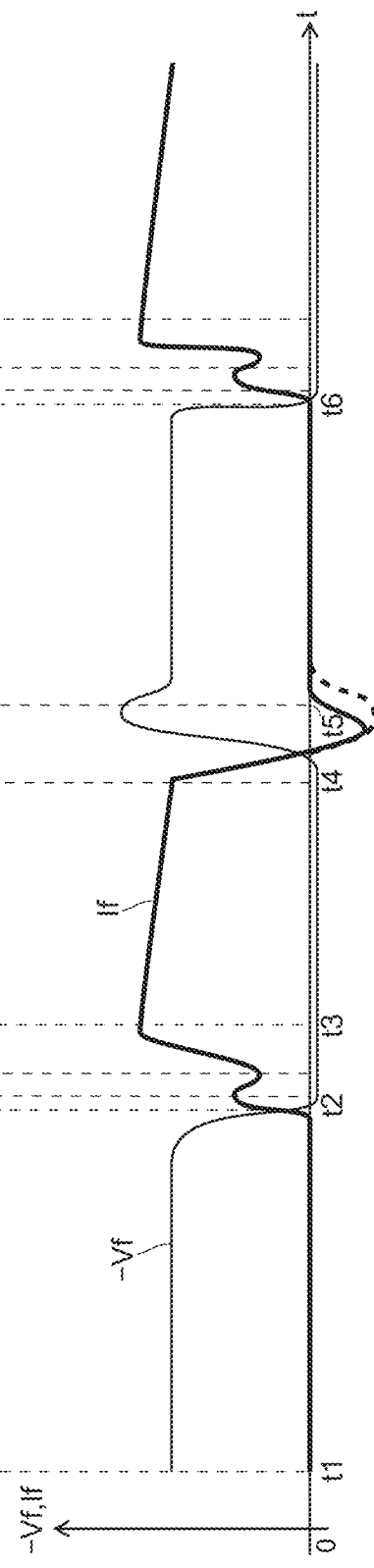

POWER CONVERSION CIRCUIT

RELATED APPLICATIONS

The present application is a National Phase of International Application Number PCT/JP2017/041402, filed Nov. 17, 2017.

TECHNICAL FIELD

The present invention relates to a power conversion circuit.

BACKGROUND ART

Conventionally, there has been known a power conversion circuit which includes a MOSFET having a superjunction structure (see patent document 1, for example).

A conventional power conversion circuit 900 is a step-up chopper circuit which includes a MOSFET 910 having a super junction structure; a reverse current prevention diode 920; and an inductive load (reactor) 930 (see FIG. 14).

The conventional power conversion circuit 900 includes the MOSFET 910 having the super junction structure. Accordingly, in the conventional power conversion circuit 900, the MOSFET 910 can have a high withstand voltage. Further, because of a low ON resistance of the MOSFET, it is possible to suppress the increase of a conduction loss even when a switching frequency is increased.

PRIOR ART DOCUMENT

Patent Document

Patent document 1: JP-A-2012-143060

SUMMARY OF INVENTION

Problem to be Solved by the Invention

Inventors of present invention have found that when irregularities occur in a charge balance of a super junction structure of a MOSFET of a power conversion circuit, there arises a following drawback. That is, when the power conversion circuit is turned off, there is a case where a relatively large hump waveform appears in a waveform of a drain current of the MOSFET. In such a hump waveform, during a period from a point of time when a drain current starts to decrease to a point of time when the drain current becomes 0 for the first time, a first period during which the drain current decreases, a second period during which the drain current increases, and a third period during which the drain current decreases again appear in this order (see FIG. 4A to FIG. 5B). Although such a hump waveform brings about an advantageous effect that a surge voltage of a drain-source voltage becomes small, there is a problem such as a case where a turn-off loss is increased.

The present invention has been made to overcome the above-mentioned drawback, and it is an object of the present invention to provide a power conversion circuit where a hump waveform of a drain current which appears when the power conversion circuit is turned off can be made relatively small so that a turn-off loss is minimally increased.

Solution to Problem

[1] A power conversion circuit according to the present invention is a power conversion circuit which includes:

a MOSFET having a semiconductor base substrate which includes a n-type column region and a p-type column region, the n-type column region and the p-type column region forming a super junction structure;

a freewheel diode; and an inductive load, wherein a switching frequency of the MOSFET is 10 kHz or more, the MOSFET is configured to be operated such that when the MOSFET is turned off, a drain current exhibits a waveform where, during a period from a point of time when the drain current starts to decrease to a point of time when the drain current becomes 0 for the first time, a first period during which the drain current decreases, a second period during which the drain current increases, and a third period during which the drain current decreases again appear in this order, the freewheel diode is a lifetime-controlled Si-FRD or SiC-SBD, in a case where the power conversion circuit is operated with a rated maximum load or a rated maximum regenerative current, at a peak of a forward current of the freewheel diode, current density obtained by dividing a current value of the forward current by an area of an active region of the freewheel diode falls within a range of 200 A/cm$^2$ to 400 A/cm$^2$ when the freewheel diode is the Si-FRD, and the current density falls within a range of 400 A/cm$^2$ to 1500 A/cm$^2$ when the freewheel diode is the SiC-SBD.

[2] According to the power conversion circuit of the present invention, it is preferable that the freewheel diode be the lifetime-controlled Si-FRD.

[3] According to the power conversion circuit of the present invention, it is preferable that the freewheel diode be the SiC-SBD.

[4] According to the power conversion circuit of the present invention, it is preferable that the freewheel diode have a MPS structure or a JBS structure.

[5] According to the power conversion circuit of the present invention, it is preferable that a rate of a sum of three losses consisting of a turn-off loss which occurs when the MOSFET is turned off, a turn-on loss which occurs when the MOSFET is turned on, and a recovery loss of the freewheel diode occupies with respect to a total loss in the power conversion circuit be larger than a rate that a conduction loss of the freewheel diode occupies with respect to the total loss in the power conversion circuit.

[6] According to the power conversion circuit of the present invention, it is preferable that, in the MOSFET, a total amount of dopant in the n-type column region be larger than a total amount of dopant in the p-type column region.

[7] According to the power conversion circuit of the present invention, it is preferable that, in the MOSFET, a total amount of dopant in the n-type column region be equal to a total amount of dopant in the p-type column region.

[8] According to the power conversion circuit of the present invention, it is preferable that, in the MOSFET, a total amount of dopant in the p-type column region be more than 1.00 times as large as a total amount of dopant in the n-type column region and be equal to or less than 1.03 times as large as the total amount of dopant in the n-type column region

[9] According to the power conversion circuit of the present invention, it is preferable that, in the MOSFET, a decrease amount of the drain current per unit time during the third period be smaller than a decrease amount of the drain current per unit time during the first period.

[10] According to the power conversion circuit of the present invention, it is preferable that the MOSFET be configured to be operated such that when the MOSFET is turned off, a period during which a gate-source voltage is temporarily increased appears after a mirror period is finished.

[11] According to the power conversion circuit of the present invention, it is preferable that the semiconductor base substrate in the MOSFET further include: a p-type base region formed on a surface of the n-type column region and a surface of the p-type column region; and a n-type source region formed on a surface of the base region, and the MOSFET be a trench-gate-type MOSFET which further includes: a trench where the trench is formed so as to reach a depth position deeper than a deepest portion of the base region in a region where the n-type column region is positioned as viewed in a plan view, and a portion of the source region is exposed on an inner peripheral surface of the trench; and a gate electrode embedded in the inside of the trench by way of a gate insulation film formed on the inner peripheral surface of the trench.

[12] According to the power conversion circuit of the present invention, it is preferable that the semiconductor base substrate of the MOSFET include: a p-type base region formed on a surface of a portion of the n-type column region and a whole surface of the p-type column region; a n-type source region formed on a surface of the base region; and a n-type surface high concentration diffusion region formed on a portion of the surface of the n-type column region where the base region is not formed, and the MOSFET be a planar-gate-type MOSFET where the MOSFET further includes, at a first main surface side of the MOSFET, a gate electrode formed on the base region sandwiched between the source region and the n-type column region by way of a gate insulation film.

[13] According to the power conversion circuit of the present invention, it is preferable that, in the MOSFET, a source electrode be formed on one surface of the semiconductor base substrate and a drain electrode be formed on the other surface of the semiconductor base substrate, a width of the p-type column region at a source electrode side be larger than a width of the p-type column region at a drain electrode side; and a width of the n-type column region at a source electrode side be smaller than a width of the n-type column region at a drain electrode side.

[14] According to the power conversion circuit of the present invention, it is preferable that, in the MOSFET, a source electrode be formed on one surface of the semiconductor base substrate and a drain electrode be formed on the other surface of the semiconductor base substrate, in a source electrode side, dopant concentration of the p-type column region be higher than dopant concentration of the n-type column region, and in a drain electrode side, the dopant concentration of the p-type column region be lower than the dopant concentration of the n-type column region.

Advantageous Effects of the Present Invention

According to the power conversion circuit of the present invention, in a case where the power conversion circuit is operated with a rated maximum load or a rated maximum regenerative current, at a peak of a forward current of the freewheel diode, current density obtained by dividing a current value of the forward current by an active area of the freewheel diode is 200 A/cm² or more when the freewheel diode is an Si-FRD, and is 400 A/cm² or more when the freewheel diode is an SiC-SBD and hence, an area of an active region of the freewheel diode with respect to a flowing electric current is relatively small and a junction capacitance Cj of the freewheel diode becomes small. Accordingly, an electric current component which flows from the freewheel diode to the MOSFET during the second period in which the MOSFET is turned off becomes small and hence, a hump waveform of a drain current of the MOSFET can be made relatively small (see FIG. 5A). As a result, a turn-off loss of the MOSFET can be made small.

According to the power conversion circuit of the present invention, as described above, the area of the active region of the freewheel diode is relatively small and hence, a junction capacitance Cj of the freewheel diode becomes small. Accordingly, a recovery current of the freewheel diode becomes small (see a region surrounded by a broken line B in FIG. 7) and hence, a recovery loss of the freewheel diode can be made small. Further, since a recovery current of the freewheel diode becomes small, a peak current of a drain current when the MOSFET is turned on becomes small (see a region surrounded by a broken line A in FIG. 6). Accordingly, a turn-on loss of the MOSFET can be made small.

According to the power conversion circuit of the present invention, the above-mentioned current density is equal to or less than 400 A/cm² when the freewheel diode is an Si-FRD, and is equal to or less than 1500 A/cm² when the freewheel diode is an SiC-SBD and hence, there is no possibility that an area of the active region of the freewheel diode becomes excessively small. Accordingly, heat generated from the semiconductor element or the like can be easily discharged to the outside and hence, it is possible to prevent the freewheel diode from becoming a high temperature and a heat resistance when heat generated from the semiconductor element or the like is discharged to the outside can be made relatively small. As a result, heat generated by a switching loss or a conduction loss can be efficiently discharged to the outside.

There is no possibility that an area of the active region of the freewheel diode becomes excessively small. Accordingly, even when an electric current having a large peak value which flows when the power conversion circuit in a state where the power conversion circuit is not connected to a power source is connected to the power source (rush current) penetrates the freewheel diode, it is possible to prevent the occurrence of IFSM breakdown.

According to the power conversion circuit of the present invention, a switching frequency of the MOSFET is 10 kHz or more and hence, a rate of a switching loss (including a turn-on loss, a turn-off loss, and a recovery loss) becomes larger than a rate of the conduction loss with respect to the total loss (=a conduction loss+a switching loss). Accordingly, by adopting the above-mentioned configuration, a turn-on loss, a turn-off loss and a recovery loss can be made small and hence, a total loss can be made small.

BRIEF DESCRIPTION OF DRAWINGS

FIG. 4A and FIG. 4B are schematic views of graphs showing changes with time of a drain-source voltage Vds and a drain current Id of the MOSFET 100, and changes with time of a forward voltage −Vf and a forward current If of the freewheel diode 200. FIG. 4A is the schematic view of the graph showing the changes with time of the drain-source voltage Vds and the drain current Id of the MOSFET 100, and FIG. 4B is the schematic view of the graph showing the changes with time of the forward voltage −Vf and the forward current If of the freewheel diode 200. Portions of the graph of the drain current Id indicated by a broken line in the vicinity of a point of time t3 and in the vicinity of a point of time t5 in FIG. 4A are portions of the graph of the drain current Id when an area of an active region of the freewheel diode is 4 times as large as an area of an active region of the freewheel diode according to the embodiment 1, and a portion of the graph of the forward current If indicated by a broken line in the vicinity of the point of time t5 in FIG. 4B is a portion of the graph of the forward current If when an effective area of the active region of the freewheel diode is 4 times as large as an area of the active region of the freewheel diode according to the embodiment 1. Further, In FIG. 4A and FIG. 4B, for facilitating the description of the graphs, a change in a turn-off period (period between the point of time t2 and the point of time t3) and a change in turn-on period (period between a point of time t4 and the point of time t5) are described in a spotlighted manner. Accordingly, these waveforms do not always agree with actual waveforms with respect to sizes, shapes, presence or non-presence of ringing and the like. An upward direction is taken as −Vf in setting a voltage axis in FIG. 4B by taking into account the following circumstance. That is, a forward current takes a positive value and a reverse current takes a negative value with respect to an electric current, and a forward voltage drop with respect to a junction is set to a negative value and a reverse bias is set to a positive value with respect to a voltage, and the forward voltage drop is expressed by a negative value in the graph when an electric current flows in a diode in a forward direction. Further, when a power source voltage is applied to the diode with a reverse bias, a reverse withstand voltage Vr is expressed as a positive value. Accordingly, the upward direction is taken as −Vf in setting the voltage axis by taking into account these circumstances.

FIG. 5A is the graph showing the changes with time of the drain-source voltage Vds, the gate-source voltage Vgs, and the drain current Id of a MOSFET in a power conversion circuit according to an example of this invention, and FIG. 5B is the graph showing the changes with time of the drain-source voltage Vds, the gate-source voltage Vgs, and the drain current Id of a MOSFET in a power conversion circuit according to a comparative example. The power conversion circuit according to the comparative example is a power conversion circuit which includes a freewheel diode where an area of an active region is 4 times as large as the area of the active region of the freewheel diode according to the embodiment 1 as the freewheel diode (the same definitions being applicable to FIG. 6 and FIG. 7). With respect to a lapsed time, a unit "20 nsec/div" means that 1 scale is 20 nsec. With respect to the drain-source voltage Vds, a unit "100 V/div" means that 1 scale is 100V. With respect to the gate-source voltage Vgs, a unit "2 V/div" means that 1 scale is 2V. With respect to the drain current Id, a unit "1 A/div" means that 1 scale is 1 A.

In FIG. 9, "n-type dopant rich" means that a total amount of dopant in the n-type column region is larger than a total amount of dopant in the p-type column region by 10%, "Just" means that a total amount of dopant in the n-type column region and a total amount of dopant in the p-type column region are equal, and "p-type dopant rich" means that a total amount of dopant in the p-type column region is larger than a total amount of dopant in the n-type column region by 10%. A power source voltage is 300V.

DESCRIPTION OF EMBODIMENTS

Figure 1:
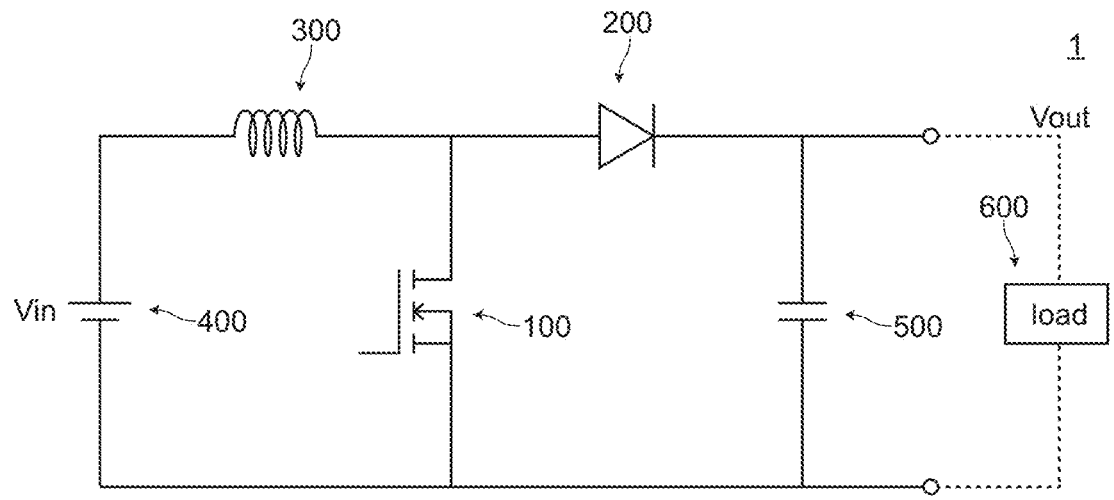
FIG. 1 is a circuit diagram showing a power conversion circuit 1 according to embodiment 1.

Hereinafter, a power conversion circuit according to the present invention is described in accordance with embodiments shown in the drawings. The respective drawings are schematic drawings, and do not always strictly reflect actual circuit configuration and actual graphs.

Embodiment 1

1. Structure of Power Conversion Circuit 1 According to Embodiment 1

A power conversion circuit 1 according to Embodiment 1 is a chopper circuit (step-up chopper circuit) which is a constitutional element such as a DC-DC converter or an inverter. The power conversion circuit 1 according to the embodiment 1 includes, as shown in FIG. 1, a MOSFET 100, a freewheel diode 200, an inductive load (reactor) 300, a power source 400, and a smoothing capacitor 500. A load 600 is connected to an external terminal of the power conversion circuit 1 according to the embodiment 1.

The MOSFET 100 controls an electric current supplied from the power source 400 to the inductive load 300 and an electric current supplied from the power source 400. To be more specific, the MOSFET 100 is switched to assume an ON state in response to a clock signal applied from a drive circuit (not shown in the drawing) to a gate electrode of the MOSFET 100, and electrically interconnects the inductive load 300 and a negative pole of the power source 400. The specific structure of the MOSFET 100 is described later.

The freewheel diode 200 performs a rectifying operation of an electric current supplied from the power source 400 to the inductive load 300. The specific structure of the freewheel diode 200 is described later.

The inductive load 300 is a passive element which can store energy in a magnetic field generated by an electric current which flows through the inductive load 300.

A positive pole (+) of the power source 400 is electrically connected to one end of the inductive load 300 and a negative pole (−) of the power source 400 is electrically connected to a source electrode of the MOSFET 100. A drain electrode of the MOSFET 100 is electrically connected to the other end of the inductive load 300 and an anode electrode of the freewheel diode 200.

2. Structure of MOSFET 100 According to Embodiment 1

Figure 2:
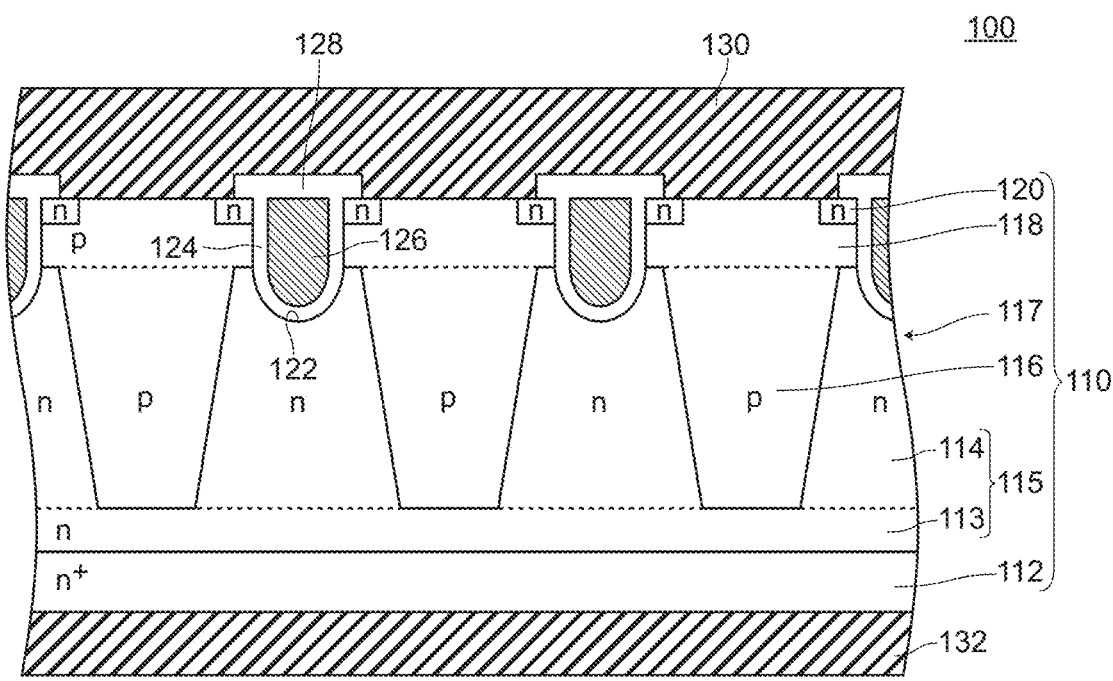
FIG. 2 is a cross-sectional view showing a MOSFET 100 according to embodiment 1.

As shown in FIG. 2, the MOSFET 100 according to the embodiment 1 is a trench-gate-type MOSFET which includes a semiconductor base substrate 110, a gate insulation film 124, a gate electrode 126, an interlayer insulation film 128, a source electrode 130, and a drain electrode 132. A drain-source withstand voltage of the MOSFET 100 is 300V or more, for example, 600V. A switching frequency of the MOSFET 100 is 10 kHz or more.

The semiconductor base substrate 110 has a low-resistance semiconductor layer 112, a n-type buffer layer 113 formed on the low-resistance semiconductor layer 112 and having a lower dopant concentration than dopant concentration of the low-resistance semiconductor layer 112, n-type column regions 114 and p-type column regions 116 formed on the buffer layer 113 where the n-type column region 114 and the p-type column region 116 are alternately arranged along a horizontal direction, a p-type base region 118 formed in surfaces (or on surfaces) of the n-type column regions 114 and in surfaces (or on surfaces) of the p-type column regions 116, and n-type source regions 120 selectively formed on a surface of the base region 118, wherein the n-type column regions 114 and the p-type column regions 116 form a super junction structure 117. The buffer layer 113 and the n-type column regions 114 are integrally formed, and the buffer layer 113 and the n-type column regions 114 form a n-type semiconductor layer 115.

In the semiconductor base substrate 110, a total amount of dopant in the n-type column region 114 is larger than a total amount of dopant in the p-type column region 116. To be more specific, a total amount of dopant in the n-type column region 114 is set to a value which falls within a range of 1.05 to 1.15 times as much as a total amount of dopant in the p-type column region 116. For example, a total amount of dopant in the n-type column region 114 is 1.10 times as much as a total amount of dopant in the p-type column region 116. In setting a total amount of dopant in the n-type column region 114 larger than a total amount of dopant in the p-type column region 116, dopant concentration of the n-type column region 114 may be set higher than dopant concentration of the p-type column region 116 or a width of the n-type column region 114 may be set larger than a width of the p-type column region 116.

"total amount of dopant" means a total amount of dopant (a n-type dopant or a p-type dopant) in a constitutional element (the n-type column region or the p-type column region) in the MOSFET.

A width of the p-type column region 116 at a source electrode 130 side is larger than the width of the p-type column region 116 at a drain electrode 132 side, and a width of the n-type column region 114 at a source electrode 130 side is smaller than the width of the n-type column region 114 at a drain electrode 132 side. The width (cross-sectional area) of the p-type column region may be gradually increased non-linearly toward a source electrode side, and the width (cross-sectional area) of the n-type column region may be gradually decreased non-linearly toward a source electrode side. In this case, (1) a region around the gate becomes p-type dopant rich so that the n-type column region 114 is liable to be depleted and hence, even when a drain voltage is increased, a potential of the n-type column region 114 around the gate becomes high minimally. Further, (2) A distance between a non-depleted region in the n-type column region 114 and the gate electrode becomes relatively long and hence, a feedback capacitance Crss (equal to a gate-drain capacitance Cgd) becomes relatively small. Accordingly, even when a potential of the n-type column region 114 (the non-depleted region of the n-type column region) is increased along with the increase of a drain voltage which takes place when the MOSFET is turned off, the gate electrode is minimally affected by a change in potential of the n-type column region. As a result, it is possible to acquire an advantageous effect that even when an irregularity exists in a charge balance around the gate, an irregularity in switching characteristics when the MOSFET is turned off can be made small compared to the prior art.

Dopant concentration of the n-type column region 114 and dopant concentration of the p-type column region 116 are respectively set to a fixed value regardless of depth.

All of the n-type column region 114, the p-type column region 116, the source region 120, and the gate electrode 126 are formed in a stripe shape as viewed in a plan view.

A thickness of the low-resistance semiconductor layer 112 falls within a range of 100 μm to 400 μm, for example, and dopant concentration of the low-resistance semiconductor layer 112 falls within a range of $1\times10^{19}$ cm$^{-3}$ to $1\times10^{20}$ cm$^{-3}$, for example. A thickness of the n-type semiconductor layer 115 falls within a range of 5 μm to 120 μm, for example. Dopant concentration of the n-type semiconductor layer 115 falls within a range of $5\times10^{13}$ cm$^{-3}$ to $1\times10^{16}$ cm$^{-3}$, for example. Dopant concentration of the p-type column region 116 falls within a range of $5\times10^{13}$ cm$^{-3}$ to $1\times10^{16}$ cm$^{-3}$, for example. A depth position of a deepest portion of the base region 118 falls within a range of 0.5 μm to 4.0 μm, for example, and dopant concentration of the base region 118 falls within a range of $5\times10^{16}$ cm$^{-3}$ to $1\times10^{18}$ cm$^{-3}$, for example. A depth position of a deepest portion of the source region 120 falls within a range of 0.1 μm to 0.4 μm, for example, and dopant concentration of the source region 120 falls within a range of $5\times10^{19}$ cm$^{-3}$ to $2\times10^{20}$ cm$^{-3}$, for example.

The trench 122 is formed in a region where the n-type column region 114 is positioned as viewed in a plan view such that the trench 122 reaches a depth position deeper than the deepest portion of the base region 118, and a portion of the source region 120 is exposed on an inner peripheral surface of the trench 122 (the portion being disposed at a position where the portion is exposed to the inner peripheral surface of the trench 122). A depth of the trench 122 is 3 μm, for example.

The gate electrode 126 is embedded in the inside of the trench 122 by way of a gate insulation film 124 formed on the inner peripheral surface of the trench 122. The gate insulation film 124 is formed of a silicon dioxide film formed by a thermal oxidation method and having a thickness of 100 nm, for example. The gate electrode 126 is made of low-resistance polysilicon formed by a CVD method or an ion implantation method.

The interlayer insulation film 128 is formed so as to cover a portion of the source region 120, the gate insulation film 124, and the gate electrode 126. The interlayer insulation film 128 is formed of a PSG film formed by a CVD method and having a thickness of 1000 nm, for example.

The source electrode 130 is formed so as to cover the base region 118, a portion of the source region 120, and the interlayer insulation film 128. The source electrode 130 is electrically connected with the source region 120. The drain electrode 132 is formed on a surface of the low-resistance semiconductor layer 112. The source electrode 130 is made of aluminum-based metal (Al—Cu-based alloy, for example) formed by a sputtering method and having a thickness of 4 µm, for example. The drain electrode 132 is formed of a multi-layered metal film such as a Ti—Ni—Au film. A total thickness of the multi-layered metal film is 0.5 µm, for example.

3. Structure of Freewheel Diode 200 According to Embodiment 1

Figure 3:
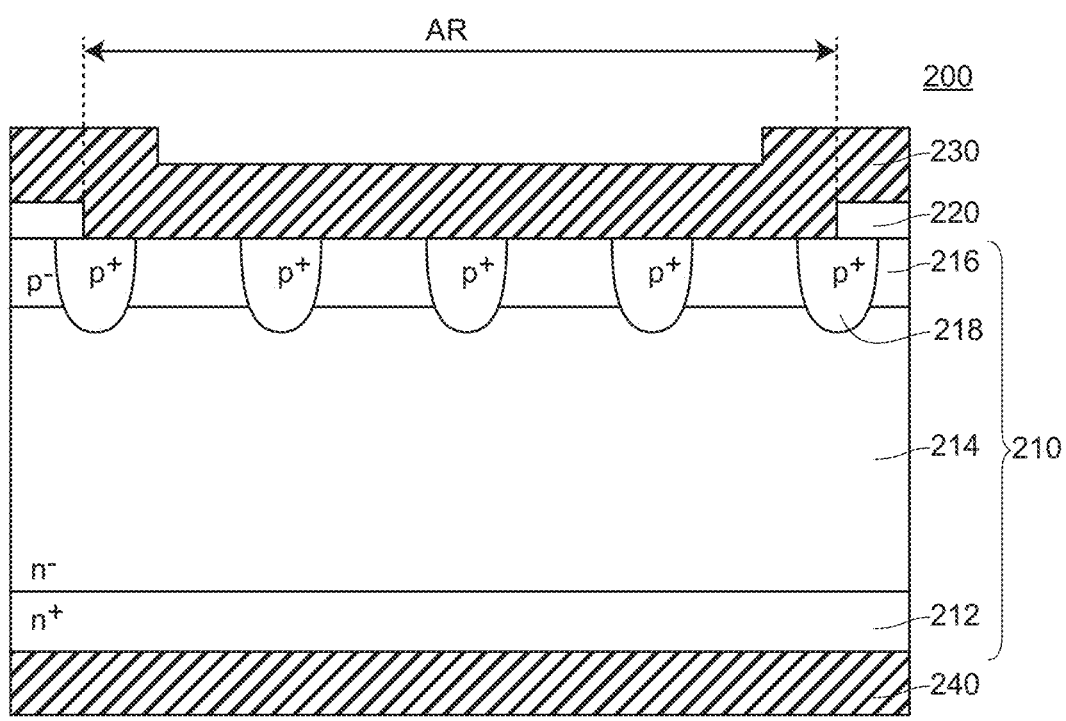
FIG. 3 is a cross-sectional view showing a freewheel diode 200 according to embodiment 1.
Figure 5A:
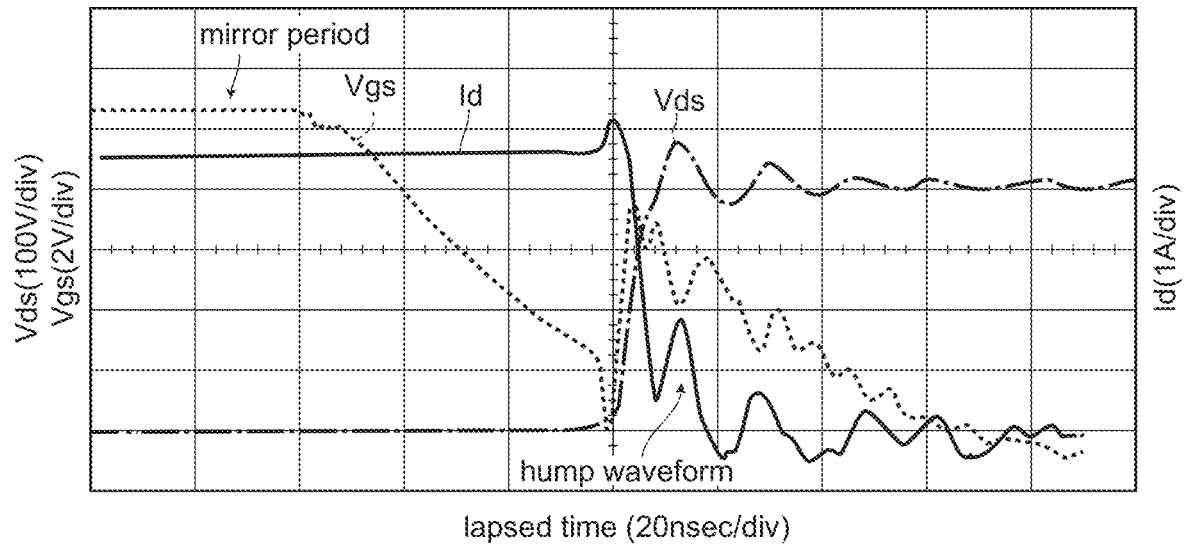
FIG. 5A and FIG. 5B are graphs showing actually measured waveforms of changes with time of a drain-source voltage Vds, a gate-source voltage Vgs, and a drain current Id of the MOSFET when the MOSFET is turned off in the case where the area of the active region of the freewheel diode is changed.
Figure 5B:
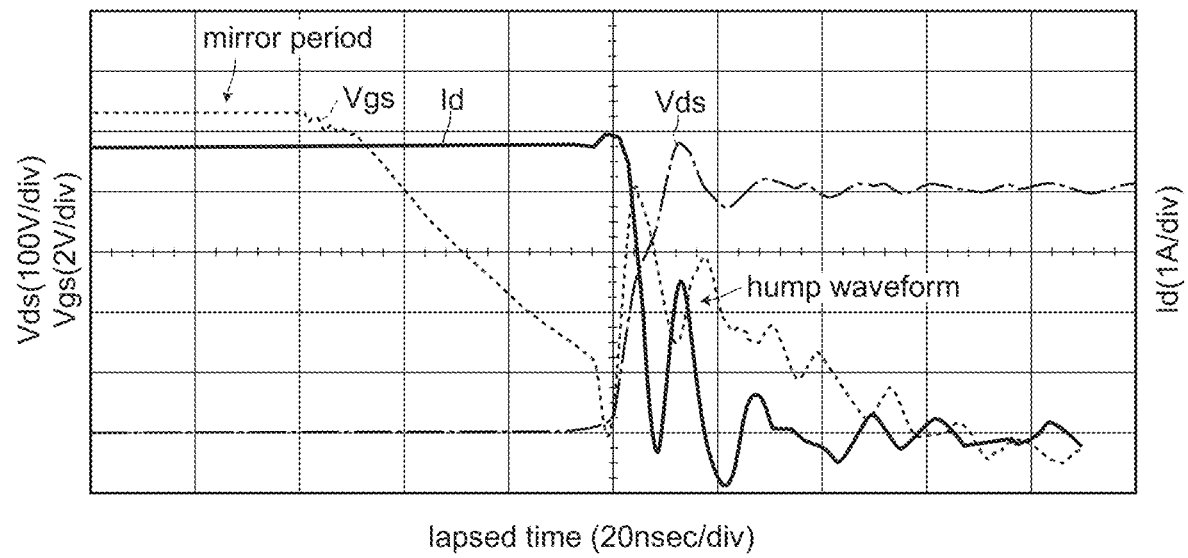

As shown in FIG. 3, the freewheel diode 200 according to the embodiment 1 is a lifetime-controlled Si-FRD (silicon-fast recovery diode) which includes a semiconductor base substrate 210, an interlayer insulation film 220, an anode electrode 230, and a cathode electrode 240.

The anode electrode 230 is formed on a first main surface (an upper main surface in FIG. 3) of the semiconductor base substrate 210. The anode electrode 230 is brought into contact with the semiconductor base substrate 210 (p-type high concentration regions 218 and a p-type semiconductor layer 216) in an active region AR. In a peripheral region, an interlayer insulation film 220 is formed on a surface of the semiconductor base substrate 210. A cathode electrode 240 is formed on a second main surface (lower main surface in FIG. 3) of the semiconductor base substrate 210.

The semiconductor base substrate 210 includes: a low-resistance semiconductor layer 212; a n-type semiconductor layer 214 formed on the low-resistance semiconductor layer 212 and having lower dopant concentration than the low-resistance semiconductor layer 212; the p-type semiconductor layer 216 formed on a surface of the n-type semiconductor layer 214; and the p-type high concentration regions 218 selectively formed on a surface of the p-type semiconductor layer 216 and formed in a penetrating manner through the p-type semiconductor layer 216 with a depth such that the p-type high concentration regions 218 reach the n-type semiconductor layer 214. A PN junction is formed between the n-type semiconductor layer 214 and the p-type semiconductor layer 216, and a PN junction is also formed between the n-type semiconductor layer 214 and the p-type high concentration regions 218.

The freewheel diode 200 is controlled by irradiation of electron beams, diffusion of heavy metal, a local lifetime control (irradiation of He or proton) or the like.

When the power conversion circuit 1 is operated at a rated maximum load of the power conversion circuit 1, at a peak of a forward current of the freewheel diode 200, current density obtained by dividing a current value of the forward current by an area (effective area) of the active region AR of the freewheel diode 200 falls within a range of 200 A/cm$^2$ to 400 A/cm$^2$.

The active region AR of the freewheel diode 200 means a substantially effective region as a diode as viewed in a plan view (a region where the anode electrode and the semiconductor base substrate are brought into contact with each other). A rated maximum load means a maximum load which the power conversion circuit can supply an electric power to the outside.

In the case where the power conversion circuit is a circuit which performs a regeneration operation, when the power conversion circuit is operated with a rated maximum load or a rated maximum regenerative current, at a peak of a forward current of the freewheel diode, current density obtained by dividing a current value of the forward current by an area of an active region AR of the freewheel diode falls within a range of 200 A/cm$^2$ to 400 A/cm$^2$.

A rated maximum regenerative current means a maximum electric current in the supply of an electric power from a load to a power source when a regeneration operation (an operation where electricity is generated by a load and generated an electric power is returned to a power source side as reverse tides when braking is applied to the load or the like) is performed.

Figure 12:
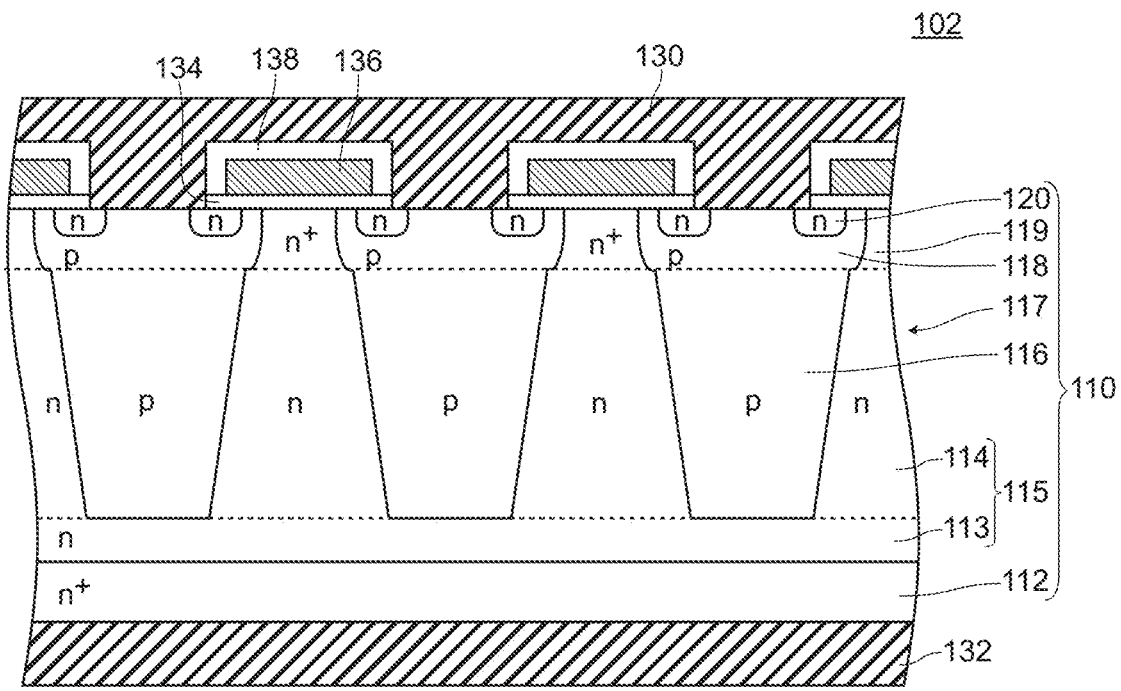
FIG. 12 is a cross-sectional view showing a MOSFET 102 according to a modification 2.

In case of the power conversion circuit which performs the above-mentioned regeneration operation, when the operation is shifted from a normal operation to the regeneration operation using the same power conversion circuit, the power conversion circuit is used by changing connection (so as to form a step-down chopper or a step-up chopper) (for example, in a conventional power conversion circuit 900, an electric power is supplied from left to right in FIG. 12 in a normal operation, and an electric power is supplied from right to left in FIG. 12 during a regeneration operation).

Also in this case, the rolls of the MOSFET and the freewheel diode are minimally different from the corresponding rolls in a normal operation. Accordingly, the features, such as the appearance of a hump waveform in a current waveform when the MOSFET is turned off and a size of the hump waveform being influenced by a junction capacitance of the freewheel diode, are substantially equal to the corresponding features in a normal operation. Further, the feature that the larger an area of the diode, the larger a recovery current becomes is also substantially same to the corresponding feature in a normal operation.

Accordingly, in the circuit which is provided on a premise that the circuit performs a regeneration operation, a condition of current density of the freewheel diode at a rated maximum current in the regeneration operation becomes equal to a condition of current density in a normal operation.

4. Operation of Power Conversion Circuit 1 According to Embodiment 1

(1) ON State (See Points of Time t1 to t2, and Points of Time t5 to t6 in FIG. 4A and FIG. 4B)

In the power conversion circuit 1 (see FIG. 1), when the MOSFET 100 is in an ON state, an electric current path from a positive pole (+) of the power source 400 to the negative pole (−) of the power source 400 through the inductive load 300 and the MOSFET 100 is formed, and an electric current flows through the electric current path. In the MOSFET 100, a channel is formed in the base region 118 so that the drain electrode 132 and the source electrode 130 are made conductive with each other, and a drain current Id is gradually increased (see FIG. 4A). On the other hand, a drain-source voltage Vds is held at 0.

In the freewheel diode 200, a depletion layer generated from a PN junction surface between a p-type region at an anode electrode side and a n-type region at a cathode electrode side expands. Accordingly, a forward current If does not flow (being 0), and a forward voltage −Vf is set to a predetermined voltage value (see FIG. 4B). At this stage of operation, electric energy of the power source 400 is stored in the inductive load 300.

(2) Turn-Off Period (See Points of Time t2 to t3 in FIG. 4A) and FIG. 4B)

When the MOSFET 100 of the power conversion circuit 1 (see FIG. 1) is turned off, an electric current which flows through the electric current path from the positive pole (+) of the power source 400 to the negative pole (−) of the power source 400 through the inductive load 300 and the MOSFET 100 is decreased and becomes 0 soon. On the other hand, the inductive load 300 generates an electromotive force for maintaining an electric current which flows through the inductive load 300. The generated electromotive force changes a reverse bias applied to the freewheel diode 200 to a forward bias so that a forward voltage −Vf is decreased and hence, a forward current flows in the freewheel diode 200. The detail of the above-mentioned operation is described hereinafter.

(2-1) First Period

In the MOSFET 100, a gate potential is largely lowered, and a channel formed in the base region 118 becomes narrow. Accordingly, electrons hardly flow from the source electrode 130 into the semiconductor base substrate 110 so that a drain current Id is lowered (see first period in FIG. 4A). On the other hand, a drain-source voltage Vds is sharply increased.

In the freewheel diode 200, a reverse bias is decreased so that carriers are moved from the PN junction surface toward the depletion layer which expands (holes at an anode electrode side going toward the depletion layer and electrons at a cathode electrode side going toward the depletion layer). Accordingly, the depletion layer is gradually narrowed and hence, a displacement current flows in the freewheel diode 200 so that a forward current If is increased (see FIG. 4B).

During the first period, a drain potential of the MOSFET 100 is increased along with a lapse of time, and a potential (an electrostatic potential) of the n-type column region 114 around the gate is also increased along with a lapse of time. Then, a lowered potential of the gate electrode 126 is increased via a gate-drain capacitance Cgd, and the channel is expanded so that a drain current Id is increased, and the MOSFET 100 is shifted to the second period.

(2-2) Second Period

In the power conversion circuit 1, an electric current which flows through the electric current path from the positive pole (+) of the power source 400 to the negative pole (−) of the power source 400 through the inductive load 300 and the MOSFET 100 is temporarily increased. On the other hand, an electric current component which flows from the inductive load 300 to the freewheel diode 200 is temporarily decreased.

In the MOSFET 100, a potential of the gate electrode is increased and, eventually, a gate-source voltage Vgs is increased so that the channel of the base region 118 is temporarily expanded. Accordingly, electrons flow from the source electrode 130 so that an electric current which flows from the drain electrode 132 to the source electrode 130 is temporarily increased (see second period shown in FIG. 4A). On the other hand, a drain-source voltage Vds is gradually increased while decreasing a rate at which the drain-source voltage Vds is increased.

In the freewheel diode 200, the movement of holes which flow from the anode electrode toward the depletion layer and contributes to the decrease of the depletion layer is temporarily stopped and, at the same time, the movement of electrons which flow from the cathode electrode toward the depletion layer and contributes to the decrease of the depletion layer is temporarily stopped. Accordingly, a displacement current does not flow in the freewheel diode 200 (in the depletion layer) so that an amount of electric current which passes through the freewheel diode 200 is decreased (a forward current If being decreased (see FIG. 4B).

(2-3) Third Period

In the power conversion circuit 1 (see FIG. 1), an electric current which flows through the electric current path from the positive pole (+) of the power source 400 to the negative pole (−) of the power source 400 through the inductive load 300 and the MOSFET 100 is decreased. On the other hand, the inductive load 300 generates an electromotive force for maintaining an electric current which flows through the inductive load 300. The generated electromotive force decreases a reverse bias applied to the freewheel diode 200.

In the MOSFET 100, a gate-source voltage Vgs starts to decrease again and, in the same manner as the first period, a channel formed in the base region 118 is narrowed so that a drain current Id is decreased (see third period shown in FIG. 4A). Accordingly, a hump waveform having a peak at a point of time when the second period and the third period are switched is formed. On the other hand, a rate (gradient) at which a drain-source voltage Vds is increased is increased again, and the drain-source voltage Vds is decreased to a rated voltage after reaching a voltage which exceeds the rated voltage.

In the freewheel diode 200, the depletion layer is narrowed again and a displacement current flows in the freewheel diode 200 and hence, a forward current If is increased again (see FIG. 4B).

When the gate-source voltage Vgs becomes less than a gate threshold value voltage, the channel disappears so that a drain current Id becomes 0 (shifted to an OFF state).

In the MOSFET 100, a decrease amount of a drain current Id per unit time during the third period is smaller than a decrease amount of a drain current per unit time during the first period (see FIG. 4A and FIG. 4B, FIG. 5A and FIG. 5B, and FIG. 9). The MOSFET 100 is operated such that when the MOSFET is turned off, a period during which a gate-source voltage is temporarily increased appears after a mirror period is finished (see FIG. 5A, FIG. 5B, and FIG. 9).

(3) OFF State (See Points of Time t3 to t4 in FIG. 4A and FIG. 4B)

In the power conversion circuit 1 (see FIG. 1), an electric current which flows through the electric current path from the positive pole (+) of the power source 400 to the negative pole (−) of the power source 400 through the inductive load 300 and the MOSFET 100 becomes 0.

In the MOSFET 100, a gate-source voltage Vgs becomes smaller than a gate threshold voltage and hence, the channel disappears and a drain current Id becomes 0. On the other hand, the drain-source voltage Vds is decreased to a rated voltage after becoming a voltage which exceeds the rated voltage and the rated voltage is maintained (see FIG. 4A).

In the freewheel diode 200, the depletion layer which expands from the PN junction surface disappears so that electrons and holes respectively directly flow in the freewheel diode 200 whereby a forward current If flows and the forward current If is gradually decreased along with a lapse of time (see FIG. 4B). On the other hand, a forward voltage −Vf takes a negative value (generating a reverse voltage) thus a conduction loss occurs.

(4) Turn-On Period (See Points of Time t4 to t5 in FIG. 4A and FIG. 4B)

When the MOSFET is turned on, in the power conversion circuit 1, an electric current path from the positive pole (+)

of the power source 400 to the negative pole (−) of the power source 400 through the inductive load 300 and the MOSFET 100 is formed, and an electric current starts to flow in the electric current path. At this point of time, a forward current which flows in the freewheel diode 200 starts to be decreased.

In the MOSFET 100, electrons flow from the source electrode 130 into the n-type column regions 114 through the source regions 120. Accordingly, a drain current Id is temporarily sharply increased and, thereafter, is sharply decreased (see FIG. 4A). On the other, a drain-source voltage Vgs is sharply decreased.

In the freewheel diode 200, although an electric current flows in a forward direction through the PN junction, a part of holes which are diffused from the anode electrode to the cathode electrode starts to return to the anode electrode. On the other hand, a part of electrons diffused from the cathode electrode to the anode electrode starts to return to the cathode electrode. Due to the movement of these carriers (electrons and holes), a forward current is decreased. Soon a depletion layer starts to expand from the PN junction surface so that holes cannot move from the anode electrode to the cathode electrode, and the electrons cannot move from the cathode electrode to the anode electrode. At this stage of operation, holes move toward an anode electrode side and electrons move toward a cathode electrode side and hence, a reverse recovery current is generated (a forward current If taking a negative value). However, when the recovery of such holes and electrons is finished, the forward current If becomes 0 (see FIG. 4B). Further, a forward voltage −Vf is sharply increased and, thereafter, the forward voltage −Vf is decreased to a rated voltage after being increased to a value which exceeds the rated voltage (surge voltage).

5. Waveform in Power Conversion Circuit 1 According to Embodiment 1

To describe the power conversion circuit 1 according to the embodiment 1, a power conversion circuit according to a comparative example is described first.

The power conversion circuit according to the comparative example basically has the configuration which is substantially same to the configuration of the power conversion circuit 1 according to the embodiment 1. However, the power conversion circuit according to the comparative example is a power conversion circuit which uses a freewheel diode where an area of an active region of the freewheel diode is 4 times as large as an area of an active region of the freewheel diode in the embodiment 1. In the power conversion circuit according to the comparative example, the MOSFET is operated such that when the MOSFET is turned off, a first period during which a drain current Id decreases, a second period during which the drain current Id increases, and a third period during which the drain current Id decreases again appear in this order (see FIG. 5B).

In the power conversion circuit according to the comparative example, when the MOSFET is turned off, the drain current Id is sharply lowered and, thereafter, the drain current Id is sharply increased to a value which is approximately ½ of a value before the drain current is lowered. Then, the drain current repeats vertical oscillation and, thereafter, becomes 0.

On the other hand, in a power conversion circuit according to an example of this invention (the power conversion circuit 1 according to the embodiment 1), in the same manner as the power conversion circuit according to the comparative example, the MOSFET 100 is operated such that when the MOSFET is turned off, during a period from a point of time when a drain current Id starts to decrease to a point of time when the drain current Id becomes 0 for the first time, the first period during which the drain current Id decreases, the second period during which the drain current Id increases, and the third period during which the drain current Id decreases again appear in this order. However, when the MOSFET is turned off, the drain current Id is lowered and, thereafter, the drain current Id is increased to a value which is approximately ⅓ of a value before the drain current is lowered. Then, the drain current repeats vertical oscillation and, thereafter, becomes 0 (see FIG. 5A). That is, a hump waveform becomes small compared to a hump waveform in the power conversion circuit according to the comparative example. Accordingly, a turn-off loss is decreased compared to the comparative example.

Next, a turn-on loss in the power conversion circuit 1 according to the embodiment 1 is described.

Figure 6:
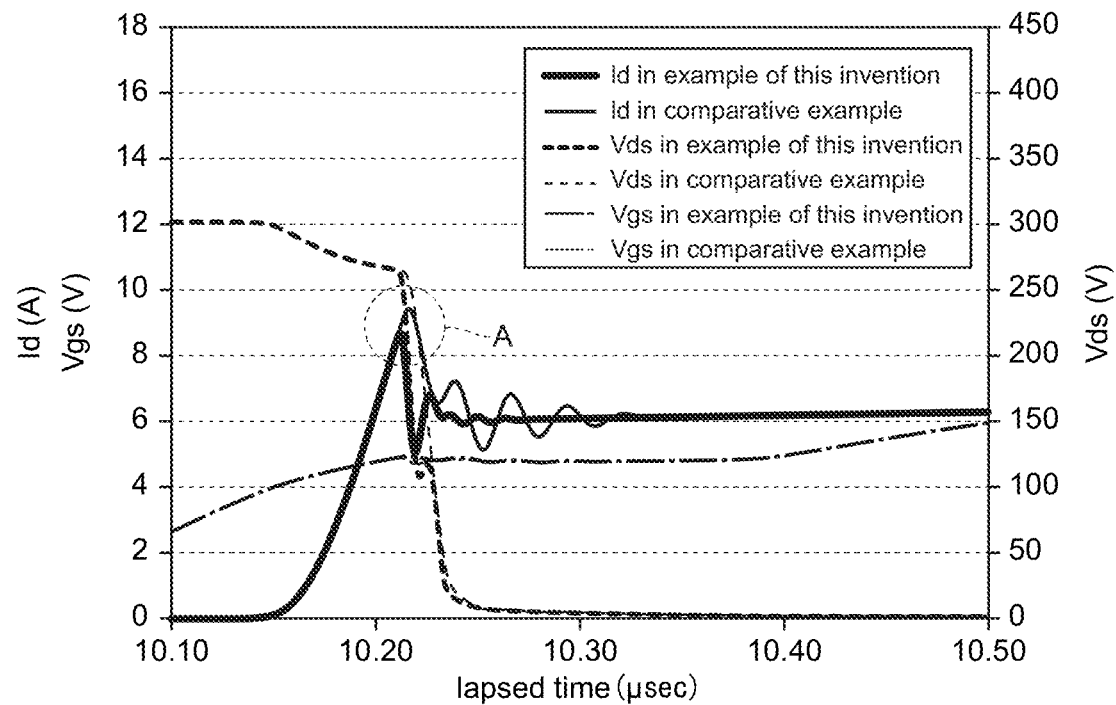
FIG. 6 is a graph showing a simulation result of a change with time of the drain-source voltage Vds when the MOSFET is turned on in the case where an area of an active region of the freewheel diode is changed.

In the power conversion circuit according to the comparative example, the MOSFET is operated such that when the MOSFET is turned on, a drain current Id is increased to a value which exceeds a steady state current (peak current) and, thereafter, approaches a steady state value while generating ringing (see a fine solid line in FIG. 6).

Further, a drain-source voltage Vds is monotonously and sharply decreased (see a fine broken line in FIG. 6).

On the other hand, in the power conversion circuit 1 according to the example of this invention, the MOSFET 100 is operated such that when the MOSFET is turned on, a peak current is small, ringing is also small, and ringing finishes earlier compared to the power conversion circuit according to the comparative example (see bold solid lines shown in FIG. 6). Accordingly, the power conversion circuit according to the example of this invention exhibits a small turn-on loss compared to the power conversion circuit according to the comparative example.

Next, a recovery loss in the power conversion circuit 1 according to the embodiment 1 is described.

Figure 7:
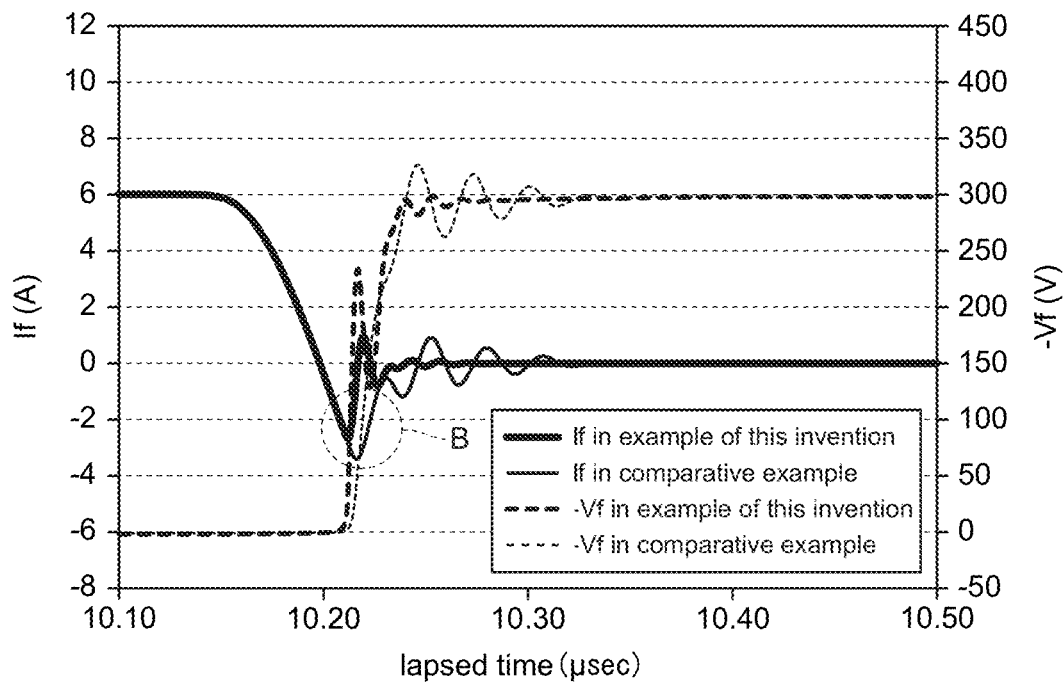
FIG. 7 is a graph (recovery waveform) showing a simulation result of changes with time of a forward voltage −Vf and a forward current If of the freewheel diode 200 when the MOSFET is turned on in the case where an area of an active region of the freewheel diode is changed.

In the power conversion circuit according to the comparative example, the freewheel diode is operated such that when the MOSFET is turned on, a forward current If is sharply lowered until the forward current If becomes a negative value and, thereafter, the forward current If is recovered to 0 while performing ringing (see a fine solid line in FIG. 7).

Further, a forward voltage −Vf is increased to a voltage which exceeds a steady state value and, thereafter, the forward voltage −Vf is converged to a steady state value while performing ringing (see a fine broken line in FIG. 7).

On the other hand, in the power conversion circuit according to the example of this invention, the freewheel diode is operated such that a reverse recovery current (peak) value Irp is small compared to the comparative example, and a reverse recovery time trr is also short compared to the comparative example and a reverse recovery capacitance Qrr is small (see bold solid line in FIG. 7). Accordingly, the power conversion circuit according to the example of this invention exhibits a small recovery loss compared to the power conversion circuit according to the comparative example.

Further, a forward voltage −Vf is sharply decreased once before the forward voltage −Vf reaches a steady state value and, thereafter, is increased to a value in the vicinity of the steady state value again. At this stage of operation, amplitude of ringing is small compared to the case of the comparative example (see a bold broken line in FIG. 7).

6. Advantageous Effects of Power Conversion Circuit 1 According to Embodiment 1

According to the power conversion circuit 1 of the embodiment 1, in a case where the power conversion circuit 1 is operated with a rated maximum load or a rated maximum regenerative current of the power conversion circuit 1, at a peak of a forward current of the freewheel diode 200, current density obtained by dividing a current value of the forward current by an active area of the freewheel diode 200 is 200 A/cm$^2$ or more when the freewheel diode 200 is an Si-FRD and hence, an area of an active region AR of the freewheel diode 200 with respect to a flowing electric current is relatively small whereby a junction capacitance Cj of the freewheel diode 200 becomes small. Accordingly, an electric current component which flows from the freewheel diode 200 to the MOSFET 100 when the MOSFET is turned off (during the second period in which MOSFET is turned off) becomes small and hence, a hump waveform of a drain current Id of the MOSFET 100 can be made relatively small (see FIG. 5A). As a result, a turn-off loss of the MOSFET can be made small.

The reason that at a peak of a forward current of the freewheel diode 200, current density obtained by dividing a current value of the forward current by an active area of the freewheel diode 200 is 200 A/cm$^2$ or more is as follows. When the current density is less than 200 A/cm$^2$, an area of the active region AR of the freewheel diode 200 becomes relatively large so that a junction capacitance Cj of the freewheel diode 200 is increased. Accordingly, an electric current component which flows from the freewheel diode 200 to the MOSFET 100 when the MOSFET 100 is turned off (during the second period in which the MOSFET 100 is turned off) becomes small and hence, it is difficult to make a hump waveform small.

According to the power conversion circuit 1 of the embodiment 1, in a case where the power conversion circuit 1 is operated with a rated maximum load or a rated maximum regenerative current, at a peak of a forward current of the freewheel diode 200, current density obtained by dividing a current value of the forward current by an active area of the freewheel diode 200 is 200 A/cm$^2$ or more when the freewheel diode 200 is an Si-FRD and hence, an area of the active region AR of the freewheel diode 200 is relatively small whereby a junction capacitance Cj of the freewheel diode 200 becomes small. Accordingly, a recovery current of the freewheel diode 200 can be made small (see a region surrounded by a broken line B in FIG. 7) and hence, a recovery loss of the freewheel diode 200 can be made small. Further, since a recovery current of the freewheel diode 200 becomes small, a peak current of a drain current Id when the MOSFET 100 is turned on becomes small (see a region surrounded by a broken line A in FIG. 6). Accordingly, a turn-on loss of the MOSFET can be made small.

According to the power conversion circuit 1 of the embodiment 1, the above-mentioned current density is equal to or less than 400 A/cm$^2$ when the freewheel diode is an Si-FRD and hence, there is no possibility that an area of the active region of the freewheel diode 200 becomes excessively small. Accordingly, heat generated from the semiconductor element or the like can be easily discharged to the outside and hence, it is possible to prevent the freewheel diode 200 from becoming a high temperature whereby a heat resistance generated when heat generated from the semiconductor element or the like is discharged to the outside can be made relatively small. As a result, heat generated by a switching loss or a conduction loss can be efficiently discharged to the outside.

There is no possibility that an area of the active region of the freewheel diode 200 becomes excessively small. Accordingly, even when an electric current having a large peak value which flows when the power conversion circuit in a state where the power conversion circuit is not connected to a power source is connected to the power source (rush current: an electric current which flows when a smoothing capacitor incorporated in the power conversion circuit is suddenly charged with a charge amount corresponding to a maximum value of a power source voltage) passes the freewheel diode 200, it is possible to prevent the occurrence of IFSM breakdown.

According to the power conversion circuit 1 of the embodiment 1, a switching frequency of the MOSFET is 10 kHz or more and hence, a rate of a switching loss (including a turn-on loss, a turn-off loss, and a recovery loss) becomes larger than a rate of the conduction loss with respect to the total loss (=a conduction loss+a switching loss). Accordingly, by adopting the above-mentioned configuration, a turn-on loss, a turn-off loss and a recovery loss can be made small and hence, a total loss can be made small.

According to the power conversion circuit 1 of the embodiment 1, the freewheel diode 200 is the lifetime-controlled Si-FRD and hence, a forward voltage −Vf is minimally increased. Accordingly, a conduction loss is minimally increased compared to the case where an Si-SBD is used as the freewheel diode 200.

According to the power conversion circuit 1 of the embodiment 1, a rate of a sum of three losses consisting of a turn-off loss which occurs when the MOSFET is turned off, a turn-on loss which occurs when the MOSFET is turned on, and a recovery loss of the freewheel diode 200 occupies with respect to a total loss in the power conversion circuit is larger than a rate that a conduction loss of the freewheel diode 200 occupies with respect to the total loss in the power conversion circuit.

With the above-mentioned configuration, a turn-on loss, a turn-off loss and a recovery loss can be decreased and hence, a total loss can be decreased.

According to the power conversion circuit 1 of the embodiment 1, in the MOSFET 100, a total amount of dopant in the n-type column region 114 is larger than a total amount of dopant in the p-type column region 116. With such a configuration, when the MOSFET 100 is turned off, the n-type column region 114 around the gate is minimally depleted. Accordingly, a drain-source withstand voltage can be increased. Further, when the MOSFET 100 is turned off, a hump waveform is generated and hence, time until a current value of a drain current Id becomes 0 can be extended. Further, a surge voltage of the MOSFET is minimally increased.

According to the power conversion circuit 1 of the embodiment 1, in the MOSFET 100, a total amount of dopant in the n-type column region 114 is larger than a total amount of dopant in the p-type column region 116. Accordingly, a time until a drain-source voltage Vds becomes maximum can be extended and, at the same time, an increment of the drain-source voltage Vds per unit time until the drain-source voltage Vds becomes maximum can be decreased and hence, oscillation is minimally generated.

According to the power conversion circuit 1 of the embodiment 1, in the MOSFET, a decrease amount of the drain current per unit time during the third period is smaller than a decrease amount of the drain current per unit time during the first period. Accordingly, when the MOSFET 100 is turned off, a surge voltage of the MOSFET 100 can be further decreased.

According to the power conversion circuit 1 of embodiment 1, the MOSFET is operated such that when the MOSFET is turned off, a period during which a gate-source voltage is temporarily increased appears after a mirror period is finished and hence, a time until a current value of a drain current Id becomes 0 can be extended with certainty and, at the same time, a decrease amount of a drain current Id per unit time during the third period can be made small with certainty. Accordingly, a surge voltage of the MOSFET 100 can be made small with certainty.

According to the power conversion circuit 1 of the embodiment 1, in the MOSFET 100, a width of the p-type column region 116 at a source electrode 130 side is larger than a width of the p-type column region 116 at a drain electrode 132 side; and a width of the n-type column region 114 at a source electrode 130 side is smaller than a width of the n-type column region 114 at a drain electrode 132 side. Accordingly, p-type dopant is rich around the gate and hence, a depletion layer can be easily extended when the MOSFET 100 is turned off and an L-load avalanche breakdown resistance can be increased.

Embodiment 2

Figure 8:
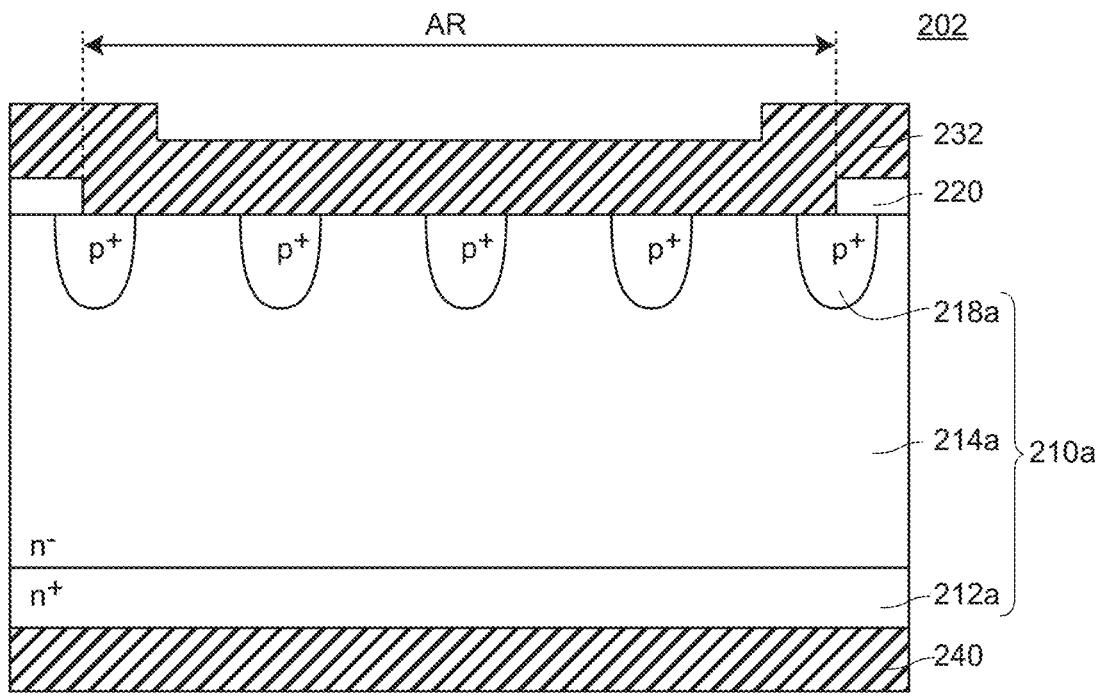
FIG. 8 is a cross-sectional view showing a freewheel diode 202 according to an embodiment 2.
Figure 9:
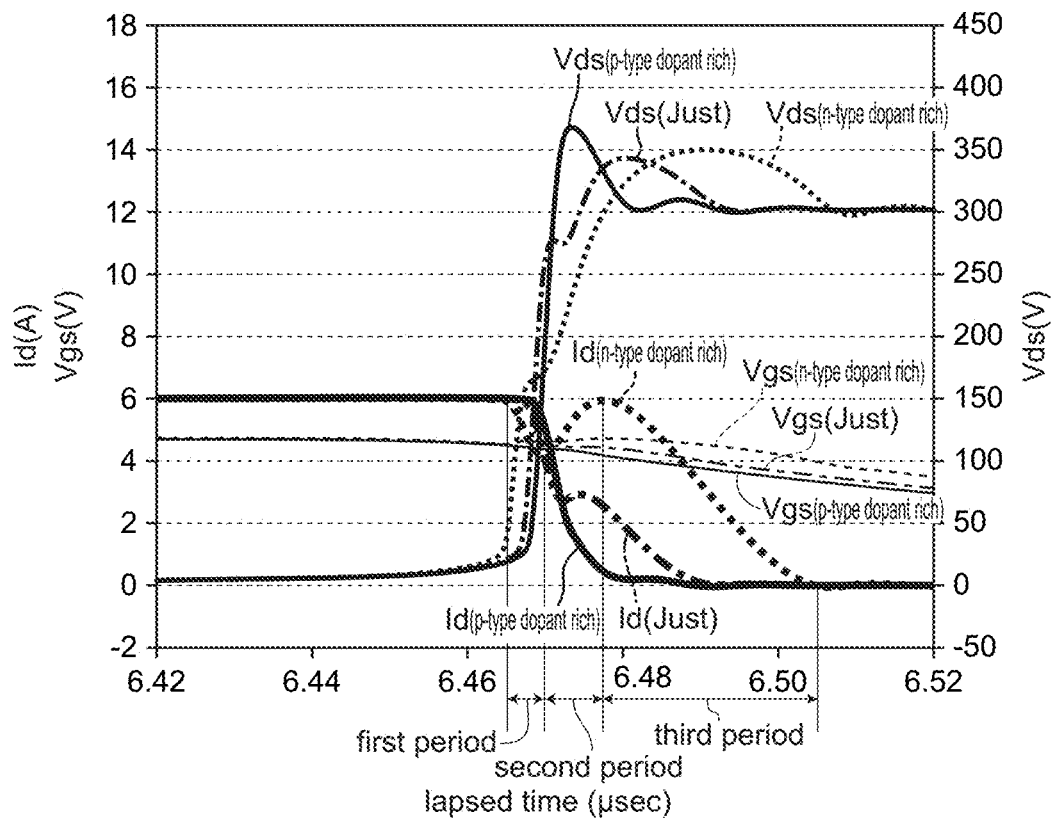
FIG. 9 is a graph showing changes with time of a drain-source voltage Vds, a gate-source voltage Vgs, and a drain current Id when a MOSFET is turned off.

A power conversion circuit according to an embodiment (not shown in the drawing) basically has the structure substantially same to the structure of the power conversion circuit 1 according to the embodiment 1. However, the power conversion circuit according to an embodiment 2 differs from the power conversion circuit 1 according to the embodiment 1 with respect to a point where a freewheel diode is a SiC-SBD (Silicon-Carbide Schottky Barrier Diode). That is, in the power conversion circuit according to the embodiment 2, as shown in FIG. 8, a freewheel diode 202 is a Schottky barrier diode where a semiconductor base substrate 210a is made of SiC (Silicon Carbide), Schottky barrier metal is disposed, at least, at a position where an anode electrode 232 is brought into contact with the semiconductor base substrate 210a, and the Schottky barrier metal and the semiconductor base substrate 210a are joined to each other by Schottky junction.

The freewheel diode 202 has a JBS structure (or a MPS structure) which is formed by combining a Schottky junction and a PN junction. That is, in the semiconductor base substrate 210a, the p-type semiconductor layer 216, which the freewheel diode 200 of the embodiment 1 has, is not formed.

When a rush current penetrates the freewheel diode 202 in a forward direction, the JBS structure (or the MPS structure) allows the current flow not only through the Schottky junction but also through the PN junction. Accordingly, it is possible to provide the structure where the Schottky junction is minimally broken and IFSM breakdown can be prevented (IFSM resistance being increased).

Current density of the freewheel diode 202 falls within a range of 400 A/cm$^2$ to 1500 A/cm$^2$. The reason current density of the freewheel diode 202 is equal to or more than 400 A/cm$^2$ unlike the freewheel diode 200 having the Si-FRD structure where current density is set equal to or more than 200 A/cm$^2$ is as follows. That is, SiC has high insulation breakdown field strength in general and hence, an SBD (Schottky Barrier Diode) having a high withstand voltage can be manufactured in a state where a thickness of a voltage resistance layer (drift layer) is small and dopant concentration is high (in general). Accordingly, a forward voltage drop can be decreased compared to a forward voltage drop in the case where the freewheel diode is made of Si. As a result, an active area can be decreased compared to the case where the freewheel diode is an Si-FRD (That is, current density can be increased compared to current density in the case where the freewheel diode is an Si-FRD).

Further, the reason current density of the freewheel diode 202 is equal to or less than 1500 A/cm$^2$ unlike the freewheel diode 200 having the Si-FRD structure where current density is equal to or less than 400 A/cm$^2$ is as follows. That is, even when a rush current penetrates the freewheel diode 202 in a forward direction, the Schottky junction is minimally broken so that the freewheel diode 202 exhibits high IFSM resistance.

When current density is high, although a SiC semiconductor is minimally broken, there is a possibility that metal or solder used as an electrode, a bonding wire or the like generates heat and is fused. Accordingly, allowable current density is limited due to limits on physical properties of surrounding members. Accordingly, it is more preferable that current density of the freewheel diode 202 fall within a range of 400 A/cm$^2$ to 1000 A/cm$^2$.

In this manner, the power conversion circuit according to the embodiment 2 differs from the power conversion circuit 1 according to the embodiment 1, with respect to the point that the freewheel diode of the embodiment 2 is an SiC-SBD. However, in the same manner as the power conversion circuit 1 according to the embodiment 1, in a case where the power conversion circuit 1 is operated with a rated maximum load or a rated maximum regenerative current of the power conversion circuit 1, at a peak of a forward current of the freewheel diode 202, current density obtained by dividing a current value of the forward current by an active area AR of the freewheel diode 202 is 400 A/cm$^2$ or more when the freewheel diode 202 is an SiC-SBD and hence, an area of an active region of the freewheel diode 202 with respect to a flowing electric current is relatively small and a junction capacitance Cj of the freewheel diode 202 becomes small. Accordingly, an electric current component which flows from the freewheel diode 202 to the MOSFET when the MOSFET is turned off (during the second period in which the MOSFET is turned off) becomes small and hence, a hump waveform of a drain current Id of the MOSFET can be made relatively small. As a result, a turn-off loss of the MOSFET can be made small.

According to the power conversion circuit of the embodiment 2, in a case where the power conversion circuit is operated with a rated maximum load or a rated maximum regenerative current, at a peak of a forward current of the freewheel diode 202, current density obtained by dividing a current value of the forward current by an active area of the freewheel diode 202 is 400 A/cm$^2$ or more when the freewheel diode 202 is an SiC-SBD and hence, an area of the active region AR of the freewheel diode 202 is relatively small with respect to an electric current which flows in the freewheel diode 202 and a junction capacitance Cj of the freewheel diode 202 becomes small. Accordingly, a recovery current of the freewheel diode 202 can be made small (see a region surrounded by a broken line B in FIG. 7) and hence, a recovery loss of the freewheel diode 202 can be made small. Further, since a recovery current of the freewheel diode 202 becomes small, a peak current of a drain current Id when the MOSFET is turned on becomes small (see a region surrounded by a broken line A in FIG. 6). Accordingly, a turn-on loss of the MOSFET can be made small.

According to the power conversion circuit of the embodiment 2, current density is set to equal to or less than 1500 A/cm$^2$ when the freewheel diode is an SiC-SBD and hence, there is no possibility that an area of the active region of the freewheel diode 202 becomes excessively small. Accordingly, heat generated from the semiconductor element or the like can be easily discharged to the outside and hence, it is possible to prevent the freewheel diode 202 from becoming a high temperature whereby a heat resistance generated when heat generated from the semiconductor element or the like is discharged to the outside can be made relatively small. As a result, heat generated by a switching loss or a conduction loss can be efficiently discharged to the outside.

There is no possibility that an area of the active region of the freewheel diode 202 becomes excessively small. Accordingly, even when an electric current (rush current), having a large peak value which flows when the power conversion circuit in a state where the power conversion circuit is not connected to a power source is connected to the power source, passes the freewheel diode 200, it is possible to prevent the occurrence of IFSM breakdown.

According to the power conversion circuit of the embodiment 2, the freewheel diode 202 is an SiC-SBD and hence, high speed switching can be realized whereby a switching loss can be reduced.

According to the power conversion circuit of the embodiment 2, the freewheel diode 202 has the JBS structure formed by combining the Schottky junction and the PN junction. Accordingly, the freewheel diode 202 becomes a diode which exhibits a low conduction loss and a small leak current and hence, it is possible to provide a power conversion circuit which exhibits a small total loss.

The freewheel diode 202 has the JBS structure. Accordingly, when a rush current passes the freewheel diode, it is possible to allow an electric current to pass the p-type high concentration region 218. Accordingly, it is possible to prevent the occurrence of IFSM breakdown with certainty.

The power conversion circuit according to the embodiment 2 has substantially the same structure as that of the power conversion circuit 1 according to the embodiment 1, except for that the freewheel diode is an SiC-SBD and hence, the power conversion circuit according to the embodiment 2 can acquire advantageous effects brought about by the structures same to the corresponding structures in the embodiment 1 among advantageous effects acquired by the power conversion circuit 1 according to the embodiment 1.

Although the present invention has been described based on the above-mentioned embodiments, the present invention is not limited to the above-mentioned embodiments. The present invention can be carried out in various modes without departing from the gist of the present invention, and, for example, the following modifications are also conceivable.

(1) The numbers, materials, shapes, positions, sizes and the like of the constitutional elements described in the above-mentioned respective embodiments are provided only for an exemplifying purpose, and can be changed within a scope where advantageous effects of the present invention are not impaired.

Figure 10:
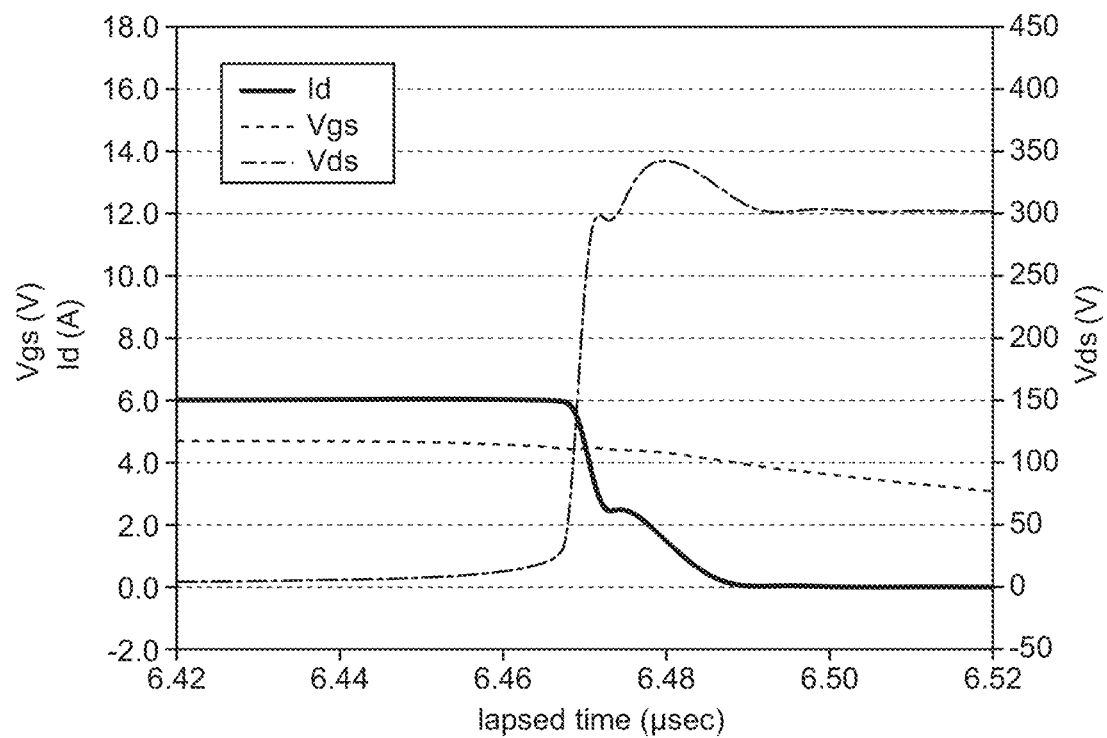
FIG. 10 is a graph showing changes with time of a drain-source voltage Vds, a gate-source voltage Vgs, and a drain current Id when the MOSFET is turned off in a case where a total amount of dopant in the p-type column region is slightly (by 2%) larger than a total amount of dopant in the n-type column region.

(2) In the above-mentioned respective embodiments, in the MOSFET, a total amount of dopant in the n-type column region is larger than a total amount of dopant in the p-type column region (n-type dopant rich). However, the present invention is not limited to this. A total amount of dopant in the n-type column region may be equal to a total amount of dopant in the p-type column region (Just), or a total amount of dopant in the p-type column region may be slightly larger than a total amount of dopant in the n-type column region (p-type dopant rich, for example, a total amount of dopant in the p-type column region being 1.00 times or more larger than a total amount of dopant in the n-type column region and 1.03 times or less than the total amount of dopant in the n-type column region). Also in this case, the MOSFET is operated such that a hump waveform appears in a drain current Id of the MOSFET (such a hump waveform being smaller than a corresponding hump waveform which appears in a drain current Id of the MOSFET in a n-type dopant rich state) (see FIG. 9 and FIG. 10).

(3) In the above-mentioned embodiment 2, an SiC-SBD having a JBS structure (or an MPS structure) is used as the freewheel diode. However, the present invention is not limited to this. An SiC-SBD having a structure other than a JBS structure or an MPS structure may be used.

In this case, the IFSM resistance is smaller than that of a JBS structure (or an MPS structure). Accordingly, it is preferable that current density of a freewheel diode fall within a range of 400 A/cm$^2$ to 1000 A/cm$^2$.

From a viewpoint of preventing the occurrence of a phenomenon that heat is generated in metal or solder used as an electrode or in a bonding wire and the electrode is fused, it is more preferable to set an upper limit of current density of a freewheel diode to a value smaller than 1000 A/cm$^2$.

Figure 11:
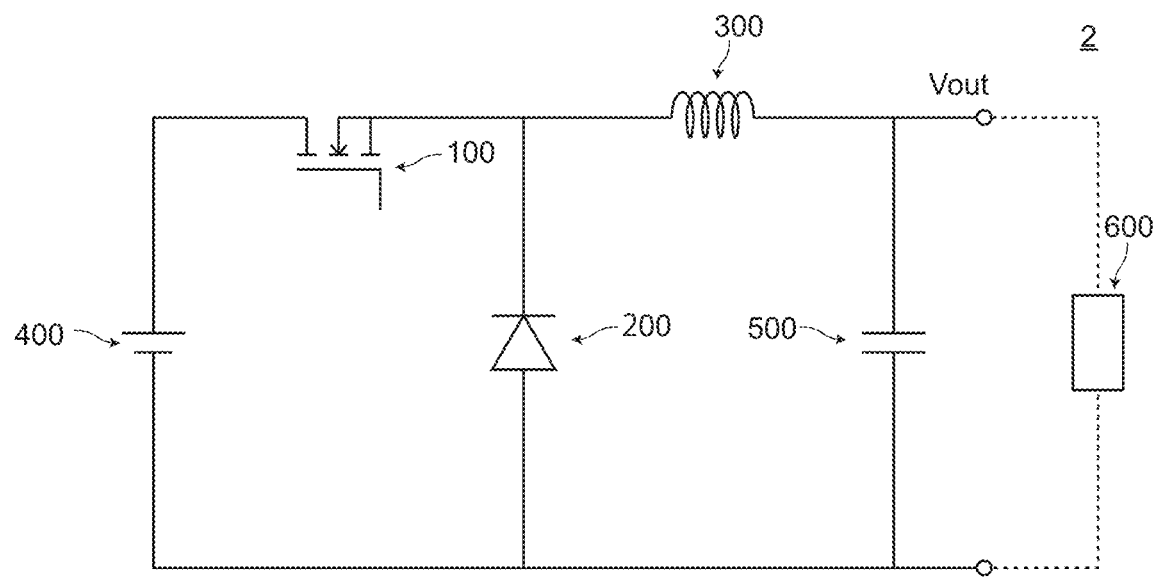
FIG. 11 is a circuit diagram of a power conversion circuit 2 according to a modification 1.

(4) A step-up chopper circuit is used as the power conversion circuit in the above-mentioned respective Embodiments. However, the present invention is not limited to them. As the power conversion circuit, a step-down chopper circuit (see FIG. 11), a full bridge circuit, a half bridge circuit, a three-phase AC converter, a non-insulation-type full bridge circuit, a non-insulation-type half bridge circuit, a push-pull circuit, a RCC circuit, a forward converter, a fly-back converter or other circuits may be used.

(5) In the above-mentioned respective embodiments, a trench-gate-type MOSFET is used as the MOSFET. However, the present invention is not limited to this. It may possible to use, as the MOSFET, a planar-gate-type MOSFET where a semiconductor base substrate 110 includes: a p-type base region 118 formed on a surface of a portion of an a n-type column region 114 and the whole surface of a p-type column region 116; a n-type source region 120 formed on a surface of the base region 118; and a n-type surface high concentration diffusion region 119 formed on a portion of a surface of the n-type column region 114 where the base region 118 is not formed, wherein the MOSFET further includes, at a first main surface side (source electrode side) of the MOSFET, a gate electrode 136 formed on the base region 118 sandwiched between the source region 120 and the n-type column region 114 (a n-type surface high concentration diffusion region 119) by way of a gate insulation film 134. (a MOSFET 102 in modification 2, see FIG. 12).

(6) In the above-mentioned respective embodiments, a width of the p-type column region at a source electrode side is larger than the width of the p-type column region at a drain electrode side, and a width of the n-type column region at a source electrode side is smaller than the width of the n-type column region at a drain electrode side. However, the present invention is not limited to this. The width of the p-type column region 116 may be a fixed value along a depth direction of the p-type column region 116.

Figure 13:
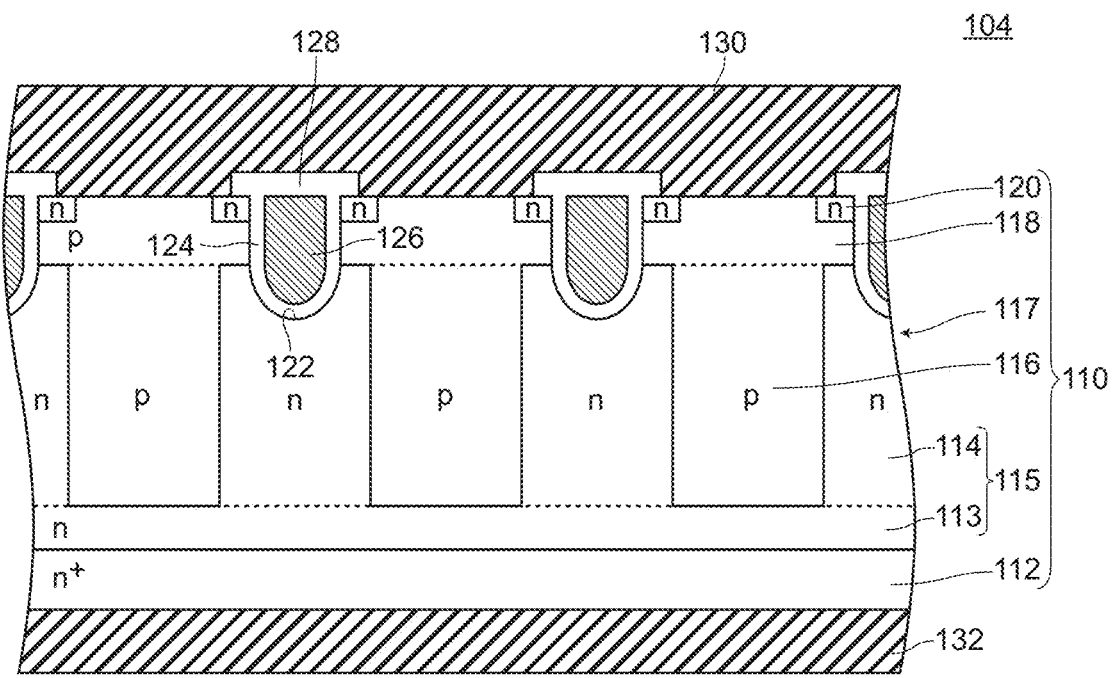
FIG. 13 is a cross-sectional view showing a MOSFET 104 according to a modification 3.
Figure 14:
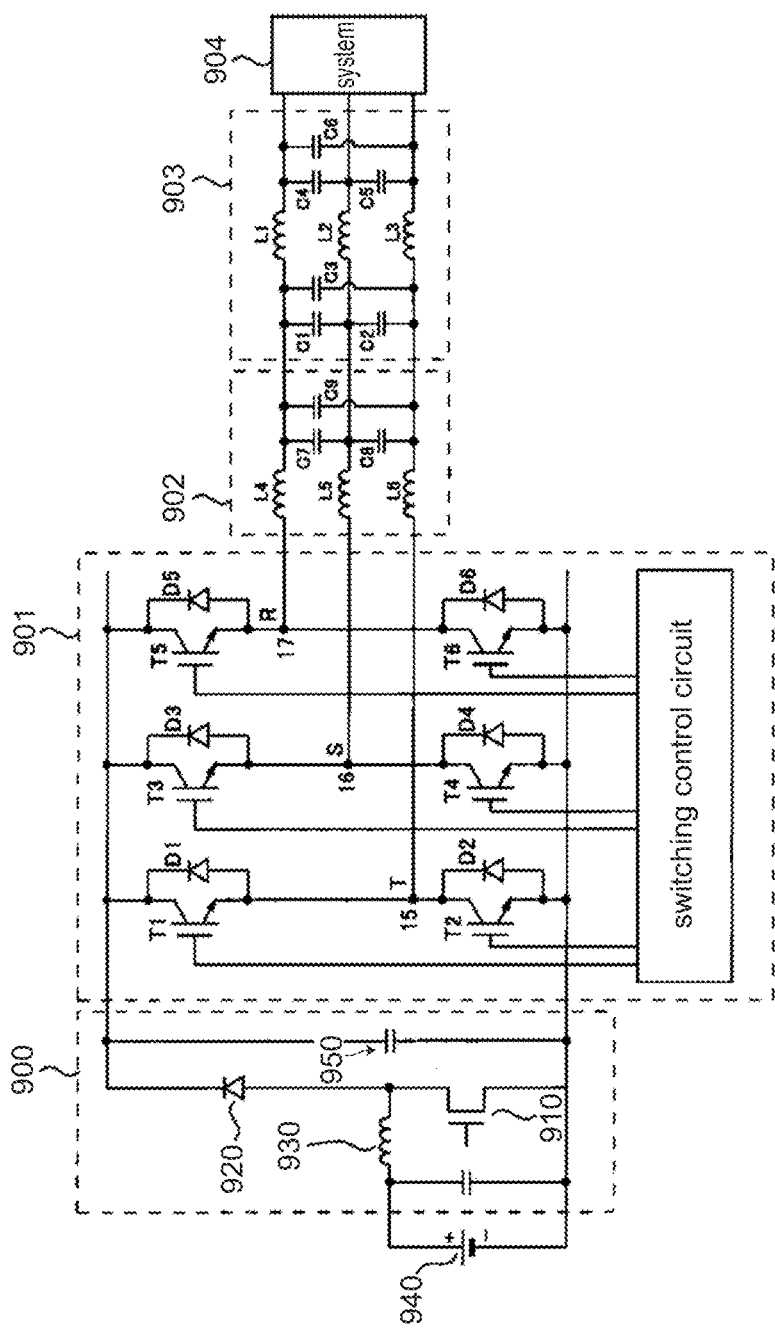
FIG. 14 is a view for describing a conventional power conversion circuit 900. Symbol 901 indicates a DC/AC converter, symbol 902 indicates a filter, symbol 903 indicates a noise filter, symbol 904 indicates a system, symbol 940 indicates a power source, and symbol 950 indicates a smoothing capacitor.

(7) In the above-mentioned respective embodiments, dopant concentration of the p-type column region 116 is a fixed value regardless of a depth of the p-type column region 116. However, the present invention is not limited to this. The structure may be adopted where dopant concentration of a p-type column region is higher than dopant concentration of a n-type column region at a source electrode side, and dopant concentration of the p-type column region is smaller than dopant concentration of the n-type column region at a drain electrode side (a MOSFET 104 in modification 3, see FIG. 13). In this case, a width of the p-type column region and a width of the n-type column region may be fixed values respectively along a depth direction of the p-type column region (see FIG. 13). Further, the width of the p-type column region at a source electrode side may be larger than the width of the p-type column region at a drain electrode side, and the width of the n-type column region at a source electrode side may be smaller than a width of the n-type column region at a drain electrode side. With such a structure, it is possible to acquire an advantageous effect that an L-load avalanche breakdown resistance can be further increased.

(8) In the above-mentioned respective embodiments, the n-type column regions 114, the p-type column regions 116, the trenches 122, and the gate electrodes 126 are formed in a stripe shape as viewed in a plan view. However, the present invention is not limited to such a structure. The n-type column regions 114, the p-type column regions 116, the trenches 122, and the gate electrodes 126 may be formed in a circular shape (in a columnar shape as viewed stereoscopically), a quadrangular frame shape, a circular frame shape, a circular grid shape or the like as viewed in a plan view.

(9) In the above-mentioned respective embodiments, a DC power source is used as the power source. However, the present invention is not limited to such a structure. An AC power source may be also used as the power source.

The invention claimed is:

1. A power conversion circuit comprising:
a MOSFET having a semiconductor base substrate which includes an n-type column region and a p-type column region, the n-type column region and the p-type column region forming a super junction structure;
a freewheel diode; and
an inductive load, wherein
a switching frequency of the MOSFET is 10 kHz or more,
the MOSFET is configured to be operated such that when the MOSFET is turned off, a drain current exhibits a waveform where, during a period from a point of time when the drain current starts to decrease to a point of time when the drain current becomes 0 for the first time, a first period during which the drain current decreases, a second period during which the drain current increases, and a third period during which the drain current decreases again appear in this order,
the freewheel diode is a lifetime-controlled Si-FRD or an SiC-SBD,
in a case where the power conversion circuit is operated with a rated maximum load or a rated maximum regenerative current, at a peak of a forward current of the freewheel diode, current density obtained by dividing a current value of the forward current by an area of an active region of the freewheel diode falls within a range of 200 A/cm$^2$ to 400 A/cm$^2$ when the freewheel diode is the Si-FRD, and the current density falls within a range of 400 A/cm$^2$ to 1500 A/cm$^2$ when the freewheel diode is the SiC-SBD,
the semiconductor base substrate in the MOSFET further includes:
a p-type base region formed on a surface of the n-type column region and a surface of the p-type column region; and
an n-type source region formed on a surface of the base region, and the MOSFET is a trench-gate-type MOSFET which further includes:
a trench where the trench is formed so as to reach a depth position deeper than a deepest portion of the base region in a region where the n-type column region is positioned as viewed in a plan view, and a portion of the source region is exposed on an inner peripheral surface of the trench; and
a gate electrode embedded in the inside of the trench by way of a gate insulation film formed on the inner peripheral surface of the trench.

2. The power conversion circuit according to claim 1, wherein the freewheel diode is the SiC-SBD.

3. The power conversion circuit according to claim 1, wherein the freewheel diode is the lifetime-controlled Si-FRD.

4. The power conversion circuit according to claim 2, wherein the freewheel diode has a MPS structure or a JBS structure.

5. The power conversion circuit according to claim 1, wherein, in the MOSFET, a total amount of dopant in the n-type column region is larger than a total amount of dopant in the p-type column region.

6. The power conversion circuit according to claim 1, wherein, in the MOSFET, a total amount of dopant in the n-type column region is equal to a total amount of dopant in the p-type column region.

7. The power conversion circuit according to claim 1, wherein, in the MOSFET, a total amount of dopant in the p-type column region is more than 1.00 times as large as a total amount of dopant in the n-type column region and is equal to or less than 1.03 times as large as the total amount of dopant in the n-type column region.

8. The power conversion circuit according to claim 1, wherein, in the MOSFET, a decrease amount of the drain current per unit time during the third period is smaller than a decrease amount of the drain current per unit time during the first period.

9. The power conversion circuit according to claim 1, wherein, the MOSFET is configured to be operated such that when the MOSFET is turned off, a period during which a gate-source voltage is temporarily increased appears after a mirror period is finished.

10. The power conversion circuit according to claim 1, wherein in the MOSFET, a source electrode is formed on one surface of the semiconductor base substrate and a drain electrode is formed on the other surface of the semiconductor base substrate,
a width of the p-type column region at a source electrode side is larger than a width of the p-type column region at a drain electrode side; and
a width of the n-type column region at a source electrode side is smaller than a width of the n-type column region at a drain electrode side.

11. The power conversion circuit according to claim 1, wherein
in the MOSFET, a source electrode is formed on one surface of the semiconductor base substrate and a drain electrode is formed on the other surface of the semiconductor base substrate,
in a source electrode side, dopant concentration of the p-type column region is higher than dopant concentration of the n-type column region, and
in a drain electrode side, the dopant concentration of the p-type column region is lower than the dopant concentration of the n-type column region.

12. The power conversion circuit according to claim 1, wherein a rate of a sum of three losses consisting of a turn-off loss which occurs when the MOSFET is turned off, a turn-on loss which occurs when the MOSFET is turned on, and a recovery loss of the freewheel diode occupies with respect to a total loss in the power conversion circuit is larger than a rate that a conduction loss of the freewheel diode occupies with respect to the total loss in the power conversion circuit.

13. A power conversion circuit comprising:
a MOSFET having a semiconductor base substrate which includes an n-type column region and a p-type column region, the n-type column region and the p-type column region forming a super junction structure;
a freewheel diode; and
an inductive load, wherein
a switching frequency of the MOSFET is 10 kHz or more,
the MOSFET is configured to be operated such that when the MOSFET is turned off, a drain current exhibits a waveform where, during a period from a point of time when the drain current starts to decrease to a point of time when the drain current becomes 0 for the first time, a first period during which the drain current decreases, a second period during which the drain current increases, and a third period during which the drain current decreases again appear in this order,
the freewheel diode is a lifetime-controlled Si-FRD or an SiC-SBD,
in a case where the power conversion circuit is operated with a rated maximum load or a rated maximum regenerative current, at a peak of a forward current of the freewheel diode, current density obtained by dividing a current value of the forward current by an area of an active region of the freewheel diode falls within a range of 200 A/cm$^2$ to 400 A/cm$^2$ when the freewheel diode is the Si-FRD, and the current density falls within a range of 400 A/cm$^2$ to 1500 A/cm$^2$ when the freewheel diode is the SiC-SBD,
the semiconductor base substrate of the MOSFET includes:
a p-type base region formed on a surface of a portion of the n-type column region and a whole surface of the p-type column region;
an n-type source region formed on a surface of the base region; and
an n-type surface high concentration diffusion region formed on a portion of the surface of the n-type column region where the base region is not formed, and
the MOSFET is a planar-gate-type MOSFET where the MOSFET further includes, at a first main surface side of the MOSFET, a gate electrode formed on the base region sandwiched between the source region and the n-type column region by way of a gate insulation film.

14. The power conversion circuit according to claim 13, wherein a rate of a sum of three losses consisting of a turn-off loss which occurs when the MOSFET is turned off, a turn-on loss which occurs when the MOSFET is turned on, and a recovery loss of the freewheel diode occupies with respect to a total loss in the power conversion circuit is larger than a rate that a conduction loss of the freewheel diode occupies with respect to the total loss in the power conversion circuit.

15. The power conversion circuit according to claim 13, wherein, in the MOSFET, a total amount of dopant in the n-type column region is larger than a total amount of dopant in the p-type column region.

16. The power conversion circuit according to claim 13, wherein, in the MOSFET, a total amount of dopant in the n-type column region is equal to a total amount of dopant in the p-type column region.

17. The power conversion circuit according to claim 13, wherein, in the MOSFET, a total amount of dopant in the p-type column region is more than 1.00 times as large as a total amount of dopant in the n-type column region and is equal to or less than 1.03 times as large as the total amount of dopant in the n-type column region.

18. The power conversion circuit according to claim 13, wherein, in the MOSFET, a decrease amount of the drain current per unit time during the third period is smaller than a decrease amount of the drain current per unit time during the first period.

19. The power conversion circuit according to claim 13, wherein, the MOSFET is configured to be operated such that when the MOSFET is turned off, a period during which a gate-source voltage is temporarily increased appears after a mirror period is finished.

20. The power conversion circuit according to claim 13, wherein in the MOSFET, a source electrode is formed on one surface of the semiconductor base substrate and a drain electrode is formed on the other surface of the semiconductor base substrate,
a width of the p-type column region at a source electrode side is larger than a width of the p-type column region at a drain electrode side; and
a width of the n-type column region at a source electrode side is smaller than a width of the n-type column region at a drain electrode side.

21. The power conversion circuit according to claim 13, wherein
in the MOSFET, a source electrode is formed on one surface of the semiconductor base substrate and a drain electrode is formed on the other surface of the semiconductor base substrate,
in a source electrode side, dopant concentration of the p-type column region is higher than dopant concentration of the n-type column region, and
in a drain electrode side, the dopant concentration of the p-type column region is lower than the dopant concentration of the n-type column region.

22. A power conversion circuit, comprising:
a MOSFET having a semiconductor base substrate which includes an n-type column region and a p-type column region, the n-type column region and the p-type column region forming a super junction structure;
a freewheel diode; and
an inductive load, wherein
a switching frequency of the MOSFET is 10 kHz or more,
the MOSFET is configured to be operated such that when the MOSFET is turned off, a drain current exhibits a waveform where, during a period from a point of time when the drain current starts to decrease to a point of time when the drain current becomes 0 for the first time, a first period during which the drain current decreases, a second period during which the drain current increases, and a third period during which the drain current decreases again appear in this order,
the freewheel diode is a lifetime-controlled Si-FRD or an SiC-SBD,
in a case where the power conversion circuit is operated with a rated maximum load or a rated maximum regenerative current, at a peak of a forward current of the freewheel diode, current density obtained by dividing a current value of the forward current by an area of an active region of the freewheel diode falls within a range of 200 A/cm² to 400 A/cm² when the freewheel diode is the Si-FRD, and the current density falls within a range of 400 A/cm² to 1500 A/cm² when the freewheel diode is the SiC-SBD, and
a rate of a sum of three losses consisting of a turn-off loss which occurs when the MOSFET is turned off, a turn-on loss which occurs when the MOSFET is turned on, and a recovery loss of the freewheel diode occupies with respect to a total loss in the power conversion circuit is larger than a rate that a conduction loss of the freewheel diode occupies with respect to the total loss in the power conversion circuit.

* * * * *